United States Patent [19]

Kitagawa et al.

[11] Patent Number: 5,162,876
[45] Date of Patent: Nov. 10, 1992

[54] SEMICONDUCTOR DEVICE HAVING HIGH BREAKDOWN VOLTAGE

[75] Inventors: Mitsuhiko Kitagawa, Tokyo; Akio Nakagawa, Hiratsuka, Japan

[73] Assignee: Kabushiki Kaisha Toshiba, Kawasaki, Japan

[21] Appl. No.: 766,076

[22] Filed: Sep. 27, 1991

[30] Foreign Application Priority Data

Sep. 28, 1990 [JP] Japan .................. 2-259064
May 31, 1991 [JP] Japan .................. 3-129535

[51] Int. Cl.$^5$ .................. H01L 29/90; H01L 27/01; H01L 29/06; H01L 29/74
[52] U.S. Cl. .................. 257/138; 257/143; 257/487; 257/928
[58] Field of Search .................. 357/91, 12, 13, 20, 357/33, 35, 36, 23.4, 23.8, 38, 86, 89

[56] References Cited

U.S. PATENT DOCUMENTS

| 4,259,683 | 3/1981 | Alder et al. | 357/64 |
| 4,587,547 | 5/1986 | Amemiya et al. | 357/59 |
| 4,866,500 | 9/1989 | Nishizawa et al. | 357/20 |
| 4,975,755 | 12/1990 | Nishizawa et al. | 357/20 |

FOREIGN PATENT DOCUMENTS 0345435 12/1989 European Pat. Off. .
2456389 12/1980 France .
56-103466 8/1981 Japan .
59-49712 3/1984 Japan .

OTHER PUBLICATIONS

Hayt, Jr. et al., "Engineering Circuit Analysis", 3rd ed., McGraw-Hill Book Co., 1978, p. 14.
IEEE Transactions on Electron Device, vol. ED-29, No. 2, Feb. 1982; Y. Amemiya et al.; "Novel Low-Loss and High-Speed Diode Utilizing an 'Ideal' Ohmic Contact".

Primary Examiner—Eugene R. LaRoche
Assistant Examiner—Michael B. Shingleton
Attorney, Agent, or Firm—Oblon, Spivak, McClelland, Maier & Neustadt

[57] ABSTRACT

A p-type emitter layer 2 is formed in one surface portion of an $n^-$-type base layer 1 of high resistance. $p^+$-type contact layers $2b$ and $n^+$-type current blocking layers 6 are formed in a preset area ratio in the surface area of the p-type emitter layer. A cathode electrode 4 is formed in contact with the contact layer $2b$ as well as the current blocking layer 6 of the pn junction diode section. With this cathode structure, the electron injection in the ON state can be suppressed so as to reduce the carrier concentration of a portion of the $n^-$-type base layer 1 lying on the cathode side, and the parasitic transistor effect caused at the time of reverse recovery can be suppressed by provision of the current blocking layer 6.

19 Claims, 30 Drawing Sheets

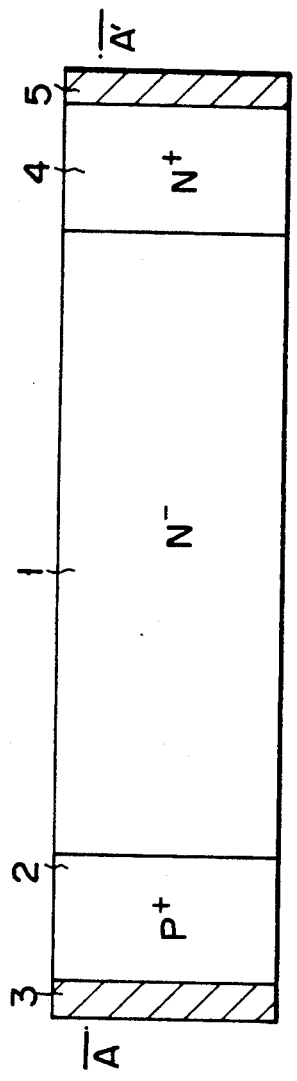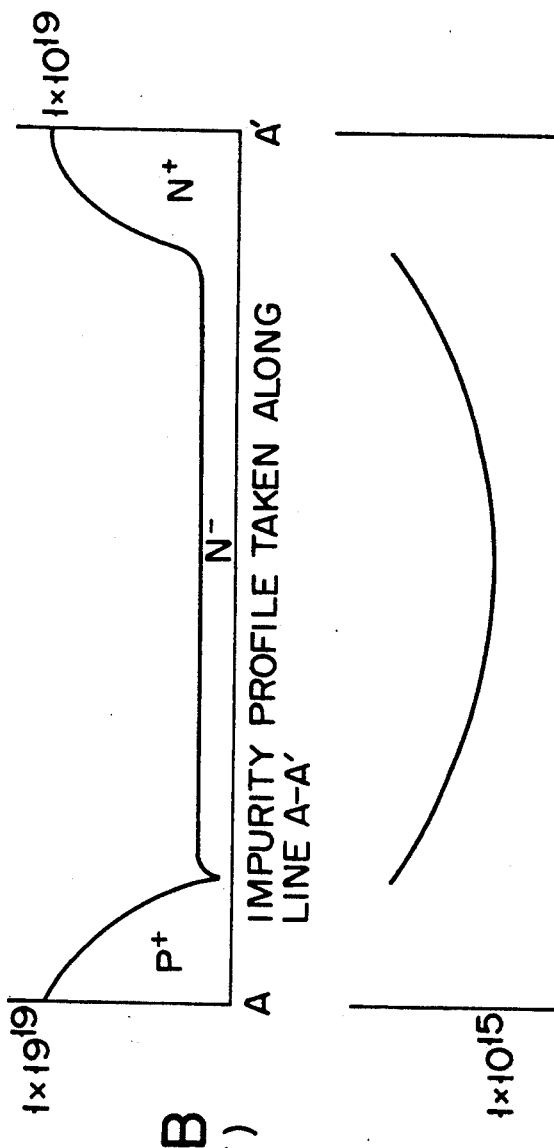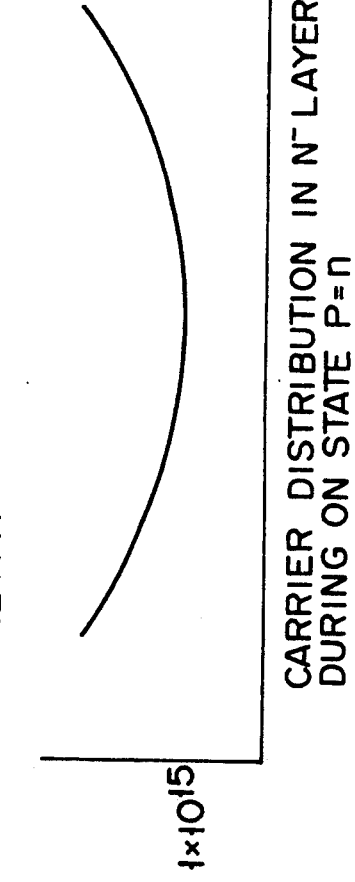
FIG. 1A (PRIOR ART)
FIG. 1B (PRIOR ART)
FIG. 1C (PRIOR ART)

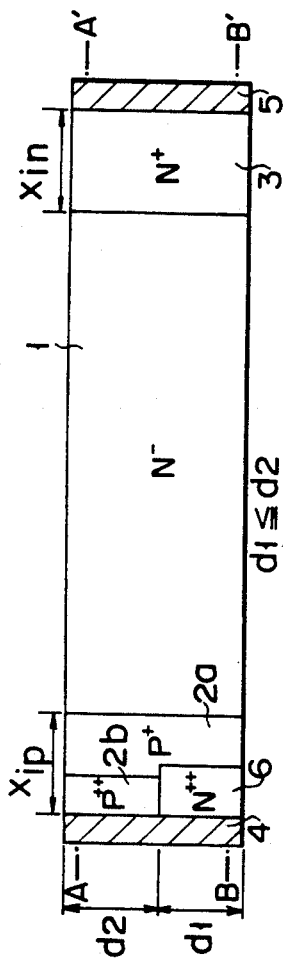
F I G. 3A
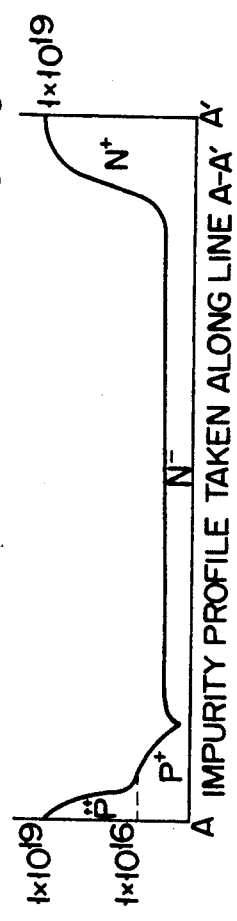
F I G. 3B  A IMPURITY PROFILE TAKEN ALONG LINE A-A'
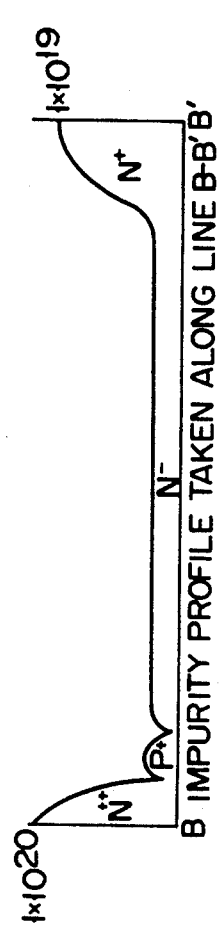
F I G. 3C  B IMPURITY PROFILE TAKEN ALONG LINE B-B'
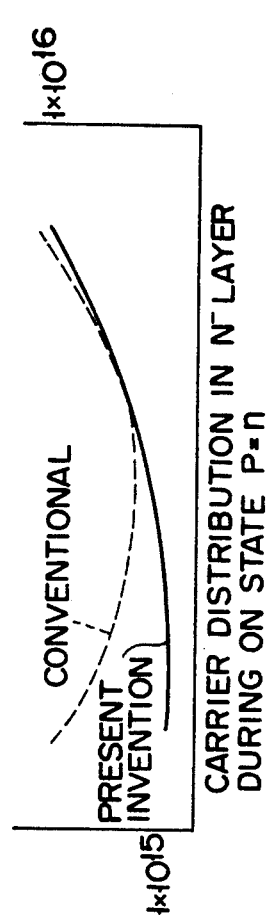
F I G. 3D  CARRIER DISTRIBUTION IN N⁻ LAYER DURING ON STATE P-n

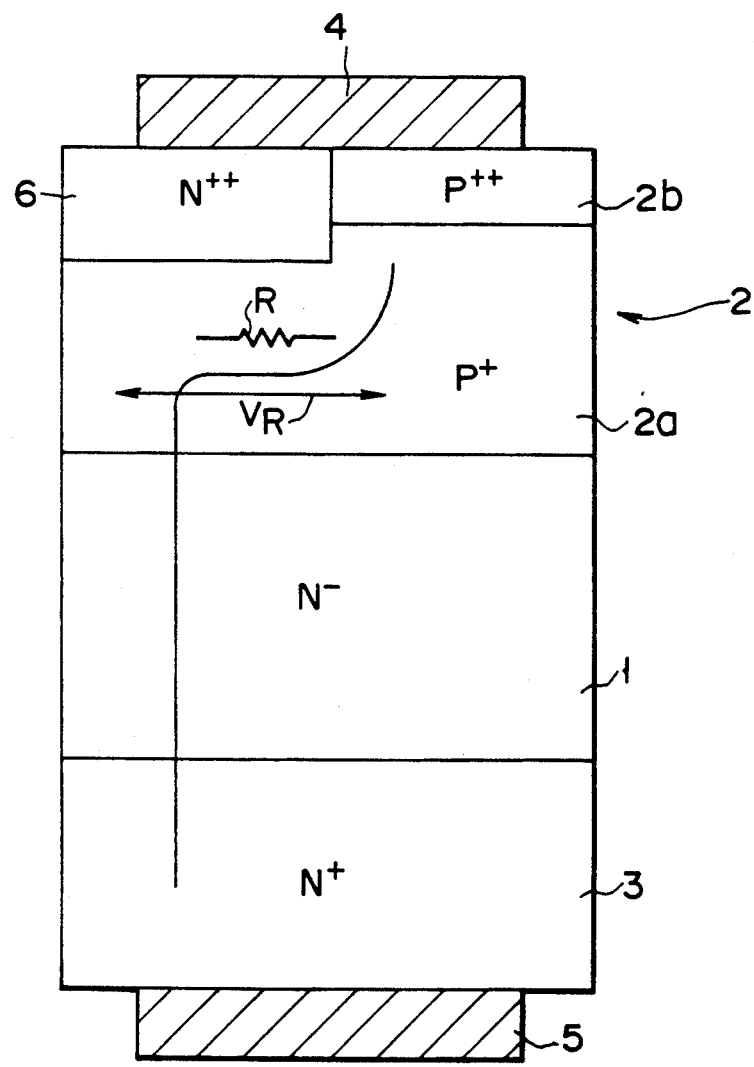
F I G. 5

STRIPE PATTERN

POLKA PATTERN

SQUARE PATTERN

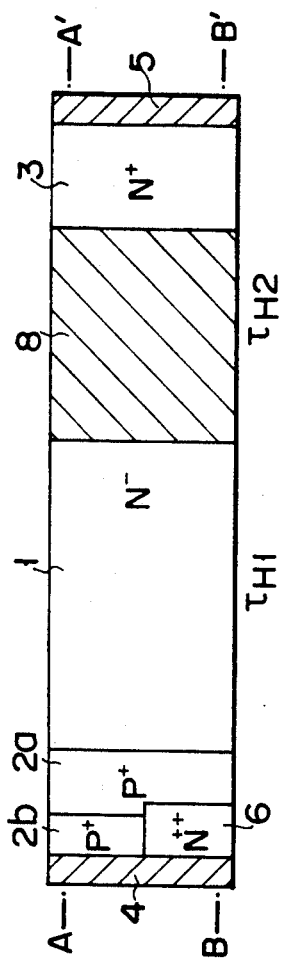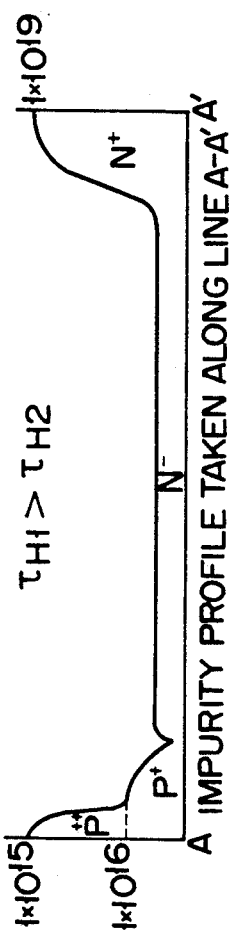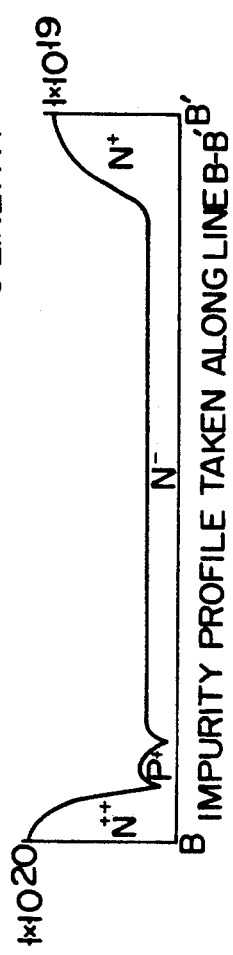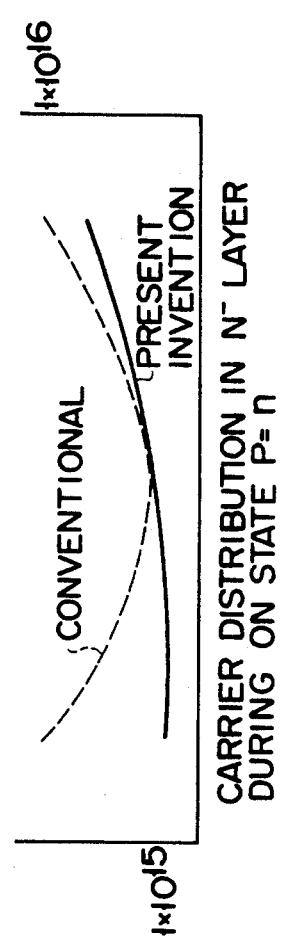
FIG. 9A
FIG. 9B
FIG. 9C
FIG. 9D

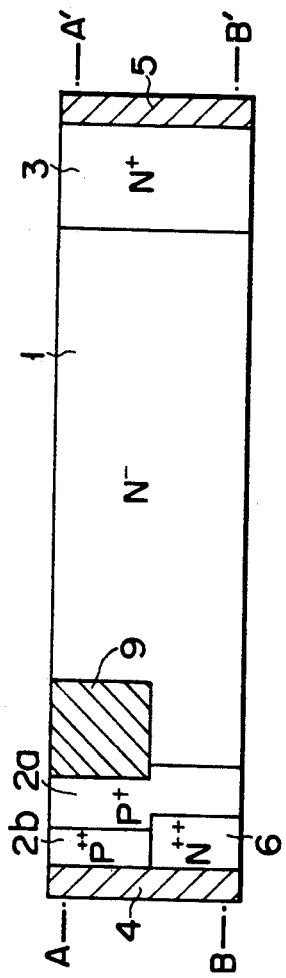
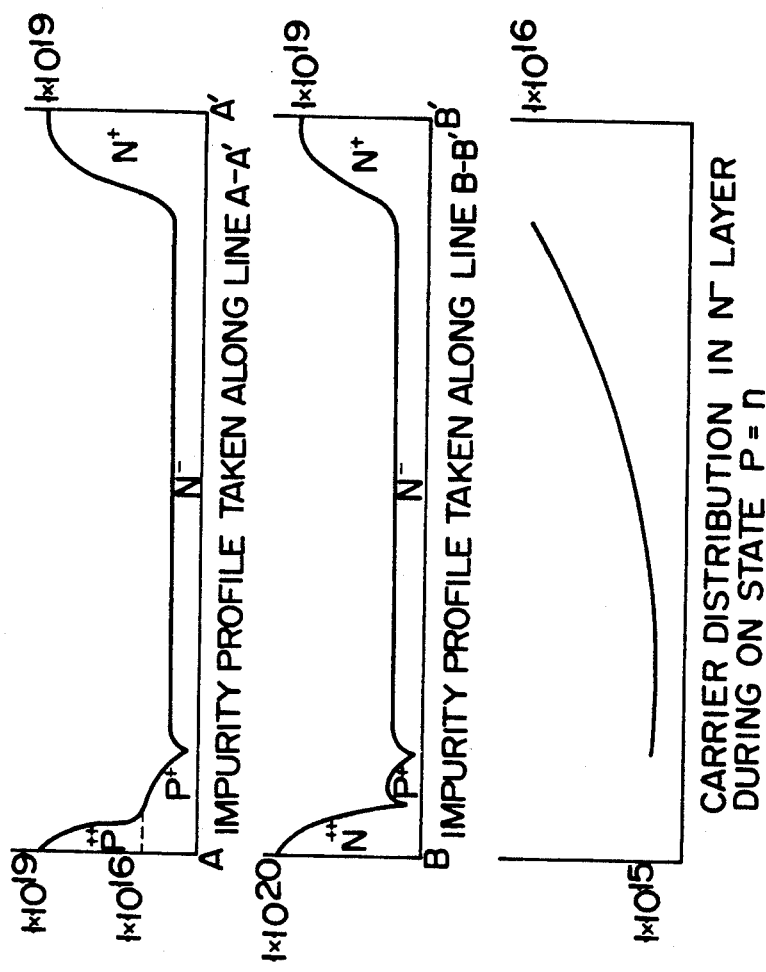
FIG. 10A
FIG. 10B
FIG. 10C
FIG. 10D

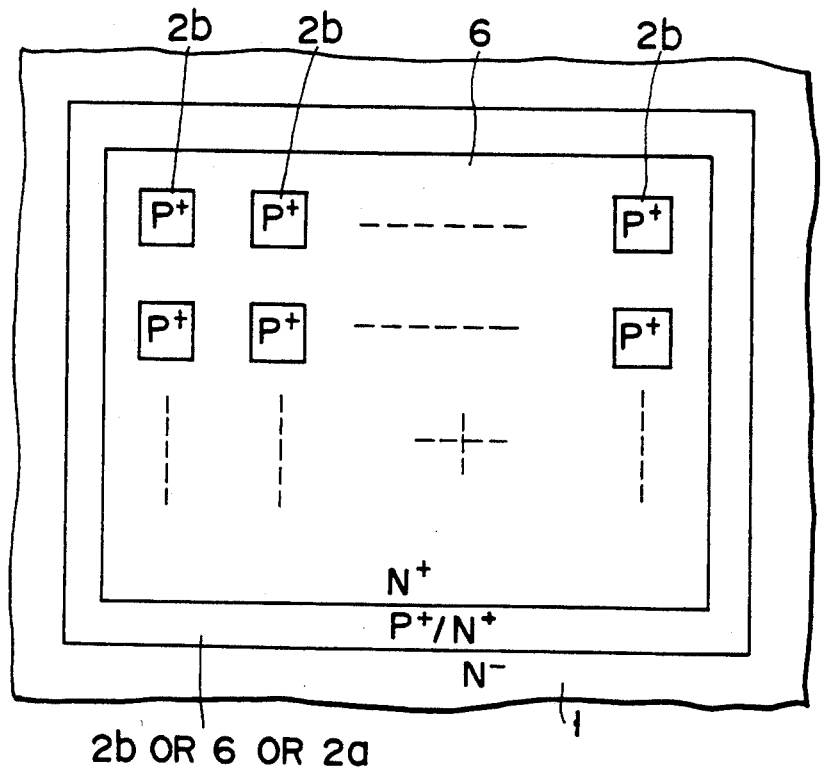
F I G. 12
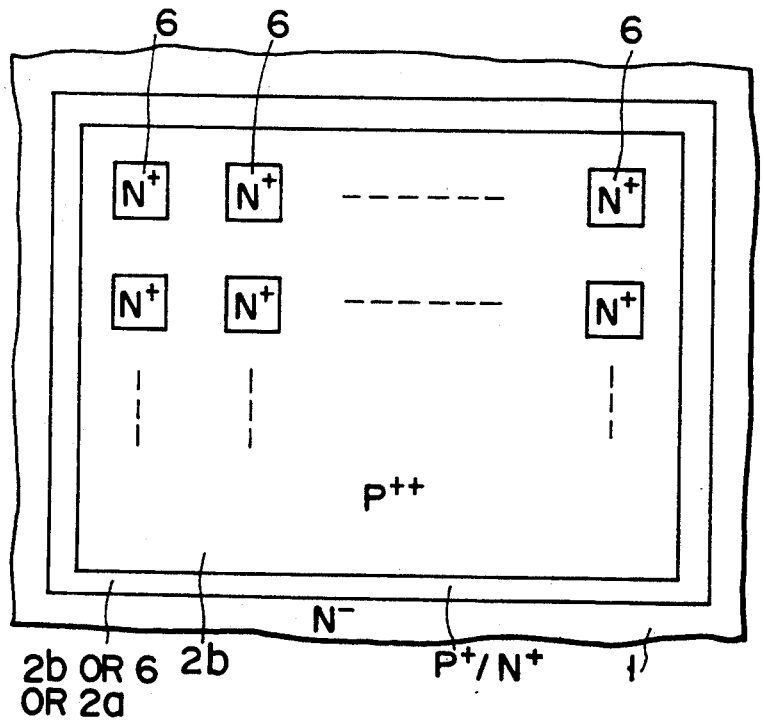
F I G. 13

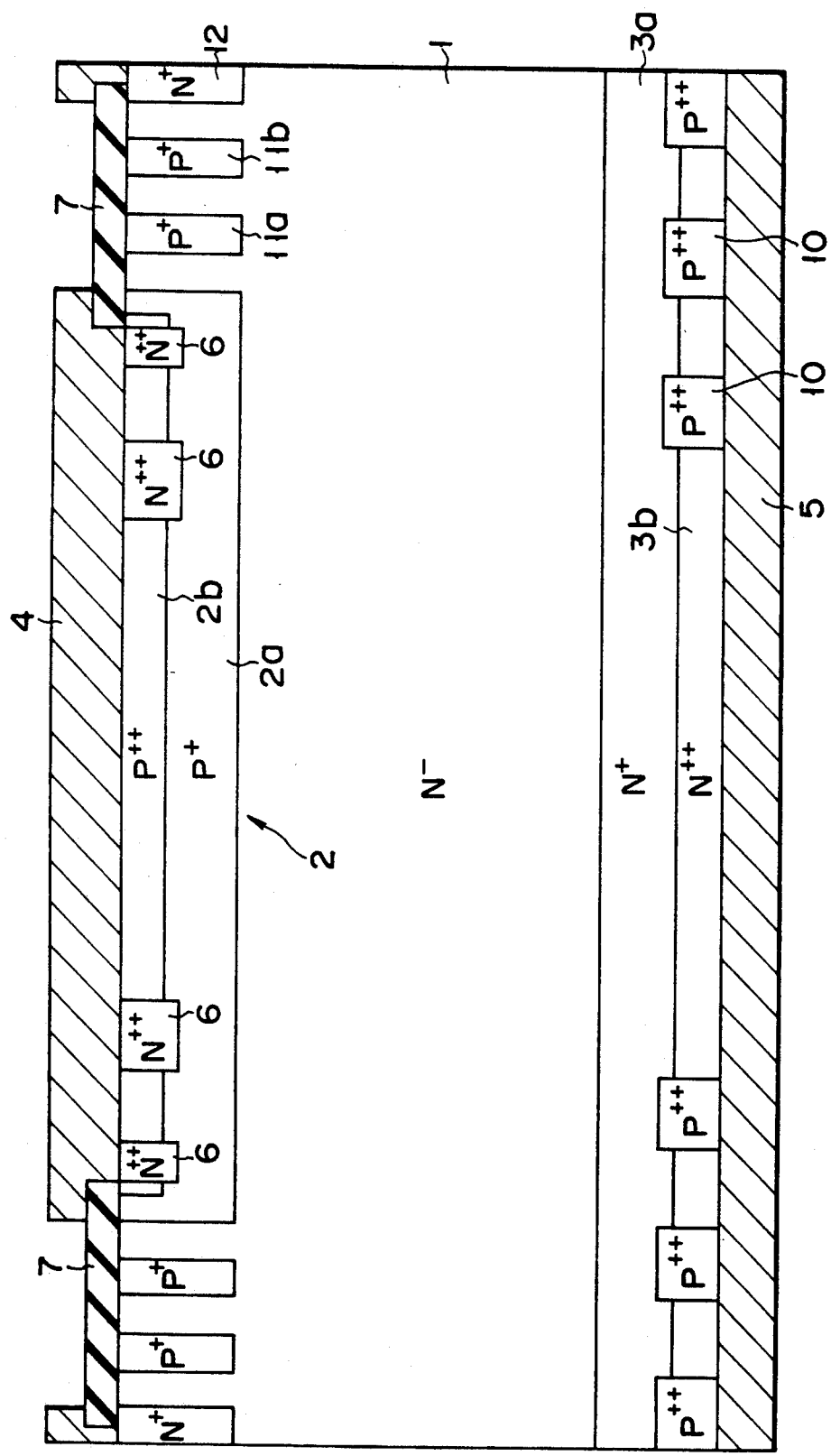
F I G. 15

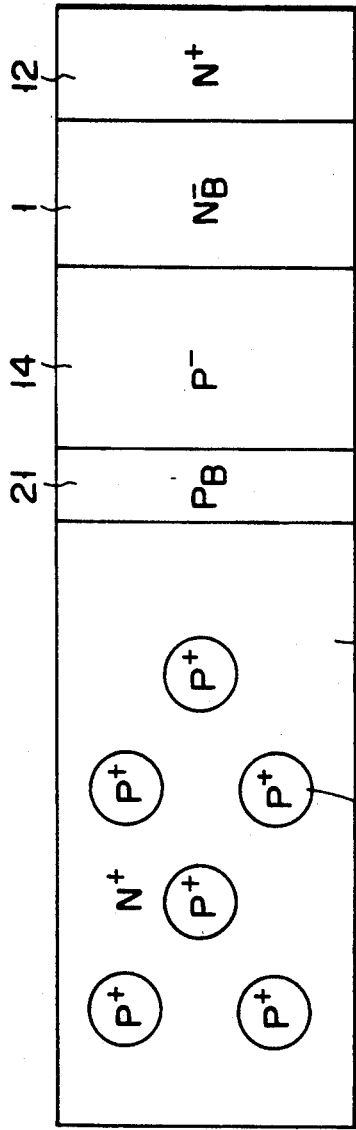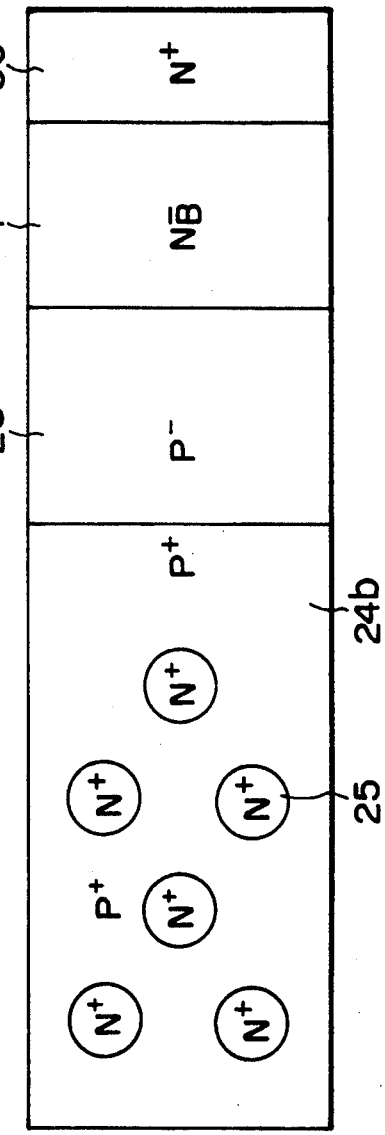
FIG. 21A  CATHODE DIFFUSION PATTERN
FIG. 21B  ANODE DIFFUSION PATTERN

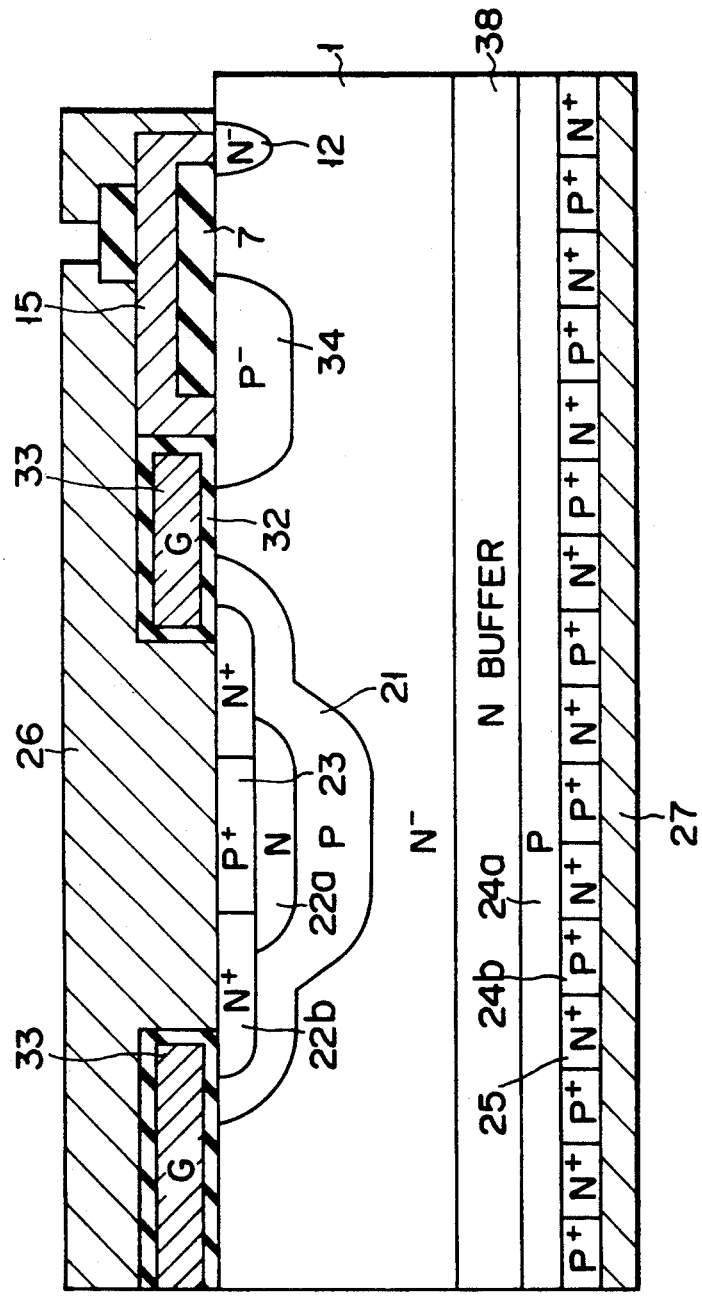
F I G. 28

A IMPURITY PROFILE TAKEN ALONG LINE A-A'

B IMPURITY PROFILE TAKEN ALONG LINE B-B'

CARRIER DISTRIBUTION IN N⁻ LAYER DURING ON STATE P=n

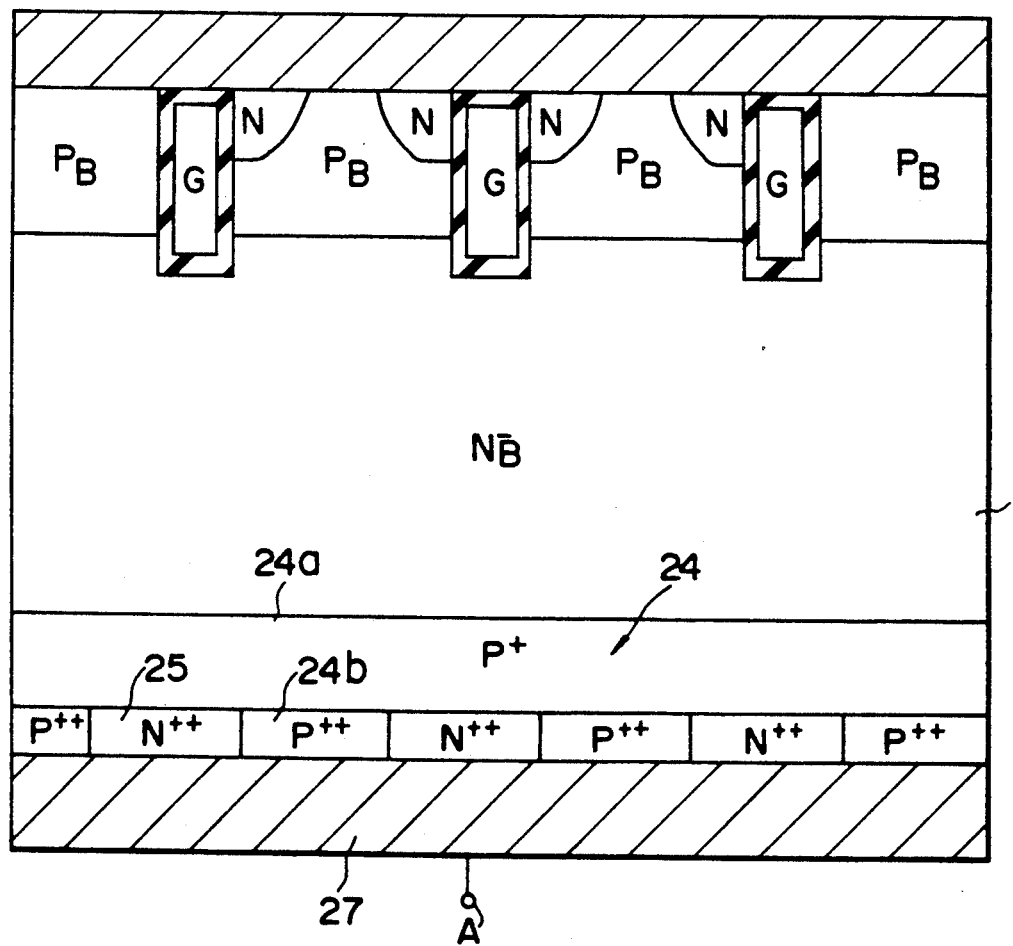
F I G. 30

SEMICONDUCTOR DEVICE HAVING HIGH BREAKDOWN VOLTAGE

BACKGROUND OF THE INVENTION

1. Field of the Invention

This invention relates to a power semiconductor device having a high breakdown voltage.

2. Description of the Related Art

FIGS. 1A, 1B and 1C respectively show the cross sectional structure of the main portion of a conventional diode having a high breakdown voltage, the distribution of impurity concentration and the distribution of carrier concentration in the ON state. An anode electrode 3 is formed over one surface of a high-resistance base layer 1 formed of $n^-$-type silicon with a $p^+$-type anode layer 2 disposed therebetween and a cathode electrode 5 is formed over the other surface of the base layer 1 with an $n^+$-type cathode layer 4 disposed therebetween. In the case of a high breakdown voltage diode having a blocking voltage of approx. 4500 V, the impurity concentration and dimension of each portion are determined such that the impurity concentration of the high-resistance base layer 1 is $1.0 \times 10^{13}$ to $1.8 \times 10^{13}$ /cm$^3$, the thickness thereof is 450 to 900 μm, the surface impurity concentration of the $p^+$-type anode layer 2 and $n^+$-type cathode layer 4 is $1 \times 10^{19}$/cm$^3$, and the thickness thereof is 14 to 70 μm. In this type of high breakdown voltage diode, an ON voltage of approx. 2.6 V can be obtained with a current of 100 A/cm$^2$. The high breakdown voltage characteristic can be attained by forming the junction end (termination) portion in the bevel structure.

In the conventional high breakdown voltage diode, a large amount of carriers are accumulated in the high-resistance base layer 1 in the highly injected state. The carrier distribution as shown in FIG. 1C is obtained. Particularly, high impurity concentration is exhibited in portions near the $n^+$-type cathode layer 4 in which electrons are injected and the $p^+$-type anode layer 2 in which holes are injected. When a large amount of carriers are thus accumulated, a large reverse recovery current flows in the OFF time in which a reverse bias voltage is applied. For example, in the case of the above element parameters, a reverse recovery current of approx. 10 mA (100 A/cm$^2$) flows when it is turned off with an application voltage of 1000 V and current variation rate di/dt=200 A/μs. Thus, large power is consumed by the reverse recovery current to generate heat. This prevents attainment of a high-speed switching operation.

As a method of improving the reverse recovery characteristic of the high breakdown voltage diode, it is known that a method of lowering the surface impurity concentration of the $p^+$-type anode layer and reducing the thickness thereof is effective (for example, IEEE TRANSACTIONS OF ELECTRON DEVICES, VOL-23, NO. 8 1976 MASAYOSHI et al, "High Current Characteristics of Asymmetrical P-i-N Diodes Having Low Forward Voltage Drops").

However, lowering the surface impurity concentration of the $p^+$-type anode layer makes it difficult to sufficiently lower the resistance of the ohmic contact between the anode layer and the anode electrode. In order to attain the good ohmic contact necessary for a power element, it is necessary to set the surface impurity concentration to approx. $1 \times 10^{19}$/cm$^3$. Further, when the impurity concentration of the anode layer is lowered and the thickness thereof is reduced, a state in which a depletion layer formed to extend in the anode layer at the time of application of reverse bias voltage reaches the anode electrode is set up and a sufficiently high breakdown voltage characteristic cannot be obtained.

As described above, in the conventional high breakdown voltage diode, a large reverse recovery current is caused to flow in the OFF time by accumulation of carriers in the thick high-resistance base layer, thereby preventing attainment of high-speed switching operation. Further, if the anode layer is formed with relatively low impurity concentration and small thickness in order to reduce the amount of carriers accumulated on the anode side, problems may occur that good ohmic contact cannot be formed and high breakdown voltage characteristic cannot be attained.

Similar problems are not limited to the high breakdown voltage diodes and may occur in other elements such as thyristors and bipolar transistors having the same diode structure.

SUMMARY OF THE INVENTION

An object of this invention is to provide a high breakdown voltage semiconductor device in which the reverse recovery characteristic is improved to attain low power consumption and high speed operation.

A high breakdown voltage semiconductor device according to this invention comprises a pn junction diode section including a semiconductor layer of a first conductivity type, a semiconductor layer of a second conductivity type formed on the semiconductor layer of the first conductivity type, contact layers of the second conductivity type with high impurity concentration and current blocking layers of the first conductivity type with high impurity concentration which is dispersedly formed in the semiconductor layer of the second conductivity type by diffusion in a preset area ratio with respect to the contact layer; and a main electrode formed in contact with the contact layer as well as the current blocking layer of the pn junction diode section; wherein are determined such that a voltage drop in the lateral direction of a portion of the semiconductor layer of the second conductivity type which lies under the current blocking layer will not exceed the built-in voltage of a junction between the semiconductor layer of the second conductivity type and the current blocking layer at the time of reverse recovery of the pn junction diode section.

Consider a case of a high breakdown voltage pn junction diode. In one aspect of this invention, the impurity concentration of the p-type anode layer (emitter layer of the second conductivity type) is reduced in comparison with the conventional case, and the n-type current blocking layer of high impurity concentration and p-type contact layer of high impurity concentration are dispersedly formed in the anode layer so as to suppress the carrier injection. With this construction, the carrier concentration in the high-resistance base layer on the anode side in the highly injected ON state can be made sufficiently lower than that on the cathode side. As a result, the reverse recovery current can be reduced. Further, the ohmic contact portion between the anode layer and the anode electrode can be formed with sufficiently low resistance by alternately arranging the p-type contact layers of sufficiently high impurity concentration and the n-type current blocking layers in the p-type anode layer. The depletion layer can be prevented from reaching the anode electrode when the reverse bias voltage is applied. Thus, a high breakdown voltage diode for high power can be obtained in which the power consumption can be reduced and the high-speed switching operation can be attained.

Further in this invention, conditions are set such that a voltage drop in the lateral direction of a portion of the semiconductor layer of the second conductivity type which lies under the current blocking layer will not exceed the built-in voltage of a junction between the semiconductor layer of the second conductivity type and the current blocking layer at the time of reverse recovery of the pn junction diode section. Therefore, the parasitic transistor effect due to the provision of the current blocking layer can be suppressed and occurrence of latch-up phenomenon can be prevented. As a result, the reverse recovery current is not increased and the switching loss can be reduced, thereby making it possible to attain the high-speed switching operation.

As described above, according to this invention, a high breakdown voltage semiconductor device can be obtained in which the distribution of carrier concentration in the element in the highly injected state can be controlled by forming the current blocking layer in the emitter layer and in which the parasitic transistor effect at the time of reverse recovery time is suppressed so as to improve the reverse recovery characteristic, thereby attaining the low power consumption and high-speed operation.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A, 1B and 1C are a view showing the construction of a main portion of a conventional high breakdown voltage diode, and diagrams respectively showing the distribution of impurity concentration and the distribution of carrier concentration in the ON state;

FIGS. 3A, 3B, 3C and 3D are a cross sectional view showing the construction of a main portion of the diode of FIG. 2A, and diagrams respectively showing the distributions of impurity concentration along the lines A-A' and B-B' of FIG. 3A and the distribution of carrier concentration in the ON state;

FIG. 5 is a diagram for illustration of the parasitic transistor effect;

FIGS. 9A, 9B, 9C and 9D are a view and diagrams corresponding to those of FIGS. 3A, 3B, 3C and 3D and showing a diode according to still another embodiment;

FIGS. 10A, 10B, 10C and 10D are a view and diagrams corresponding to those of FIGS. 3A, 3B, 3C and 3D and showing a diode according to another embodiment;

FIG. 12 is a diagram corresponding to that of FIG. 2A and showing another example of an anode side diffusion pattern;

FIG. 13 is a diagram corresponding to that of FIG. 2A and showing still another example of an anode side diffusion pattern;

FIG. 15 is a cross sectional view of an embodiment of a diode having the guard ring structure;

FIGS. 21A and 21B are plan views showing examples of diffusion patterns of the cathode and anode of FIG. 20;

FIG. 28 is a cross sectional view of an IGBT according to another embodiment of this invention;

FIGS. 30 and 31 are cross sectional views of this invention.

DETAILED DESCRIPTION OF THE PREFERRED EMBODIMENTS

There will now be described an embodiment of this invention with reference to the accompanying drawings. In the embodiments described below, a first conductivity type is a p-type and a second conductivity type is an n-type.

Figure 2A:
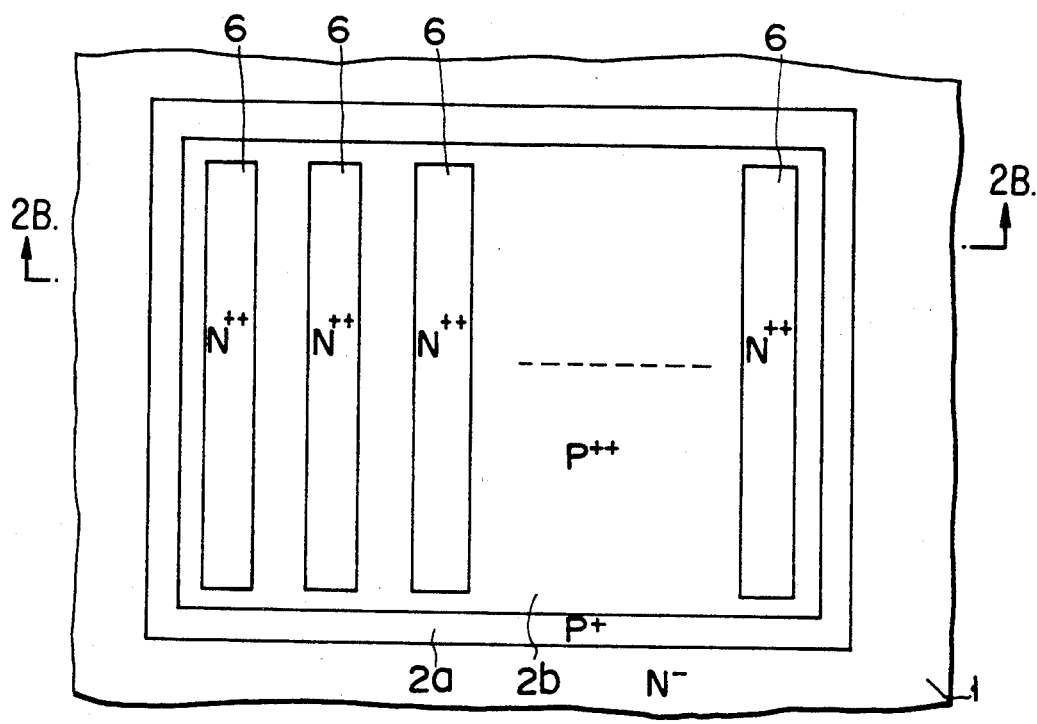
FIGS. 2A and 2B are a plan view of a diode according to one embodiment of this invention and a cross sectional view taken along the line A-A' of the plan view.
Figure 2B:
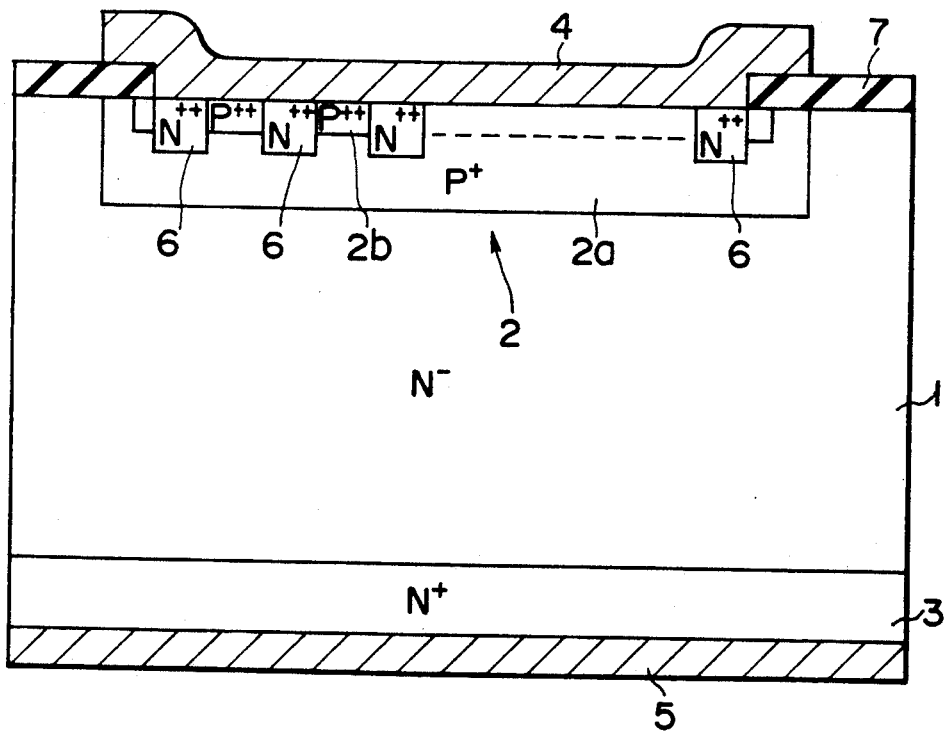

FIG. 2A is a plan view showing the anode side of a high breakdown voltage diode according to one embodiment of this invention and FIG. 2B is a cross sectional view taken along the line A-A' of FIG. 2A. A p-type emitter layer (anode layer) 2 of high impurity concentration is selectively formed by diffusion in a high-resistance $n^-$-type base layer 1. The p-type anode layer 2 has a $p^+$-type layer 2a which is the main body of the anode layer formed by diffusion in the $n^-$-type layer 1 and a $p^{++}$-type layer 2b of higher impurity concentration formed by diffusion in the layer 2a. As shown in FIG. 2A, a plurality of $n^{++}$-type layers 6 are formed by diffusion in a stripe pattern in the $p^{++}$-type layer 2b. An anode electrode 4 is formed in contact with the $p^{++}$-type layer 2b as well as the $n^{++}$-type layers 6.

The $p^{++}$-type layer 2b is a contact layer for permitting an ohmic contact of low resistance to be formed between the anode electrode 4 and the anode layer 2 and the $n^{++}$-type layers 6 are current blocking layers for reducing the area in which holes can be injected from the anode layer 2 to the $n^-$-type base layer 1. Therefore, $n^{++}$-type layers 6 are dispersedly formed in $p^{++}$-type layer 2b at a preset area ratio by taking the low-resistance contact and the hole injection amount into consideration.

An $n^+$-type cathode layer 3 of high impurity concentration is formed on the entire portion of the other surface of the $n^-$-type layer 1 and a cathode electrode 5 is formed on the cathode layer. The exposed surface of the $n^-$-type layer 1 on the anode side is covered with an oxide film 7.

Examples of the impurity concentration and the shape of each portion are explained in detail. FIG. 3A is a cross sectional view showing a basic structure portion formed of the $p^{++}$-type layer 2b and the $n^{++}$-type layer 6 adjacent to the layer 2b on the anode side of the diode according to this embodiment. FIG. 3B shows the distribution of impurity concentration along the line A-A' and FIG. 3C shows the distribution of impurity concentration along the line B-B'. The thickness of the $n^-$-type base layer 1 is 450 μm and the impurity concentration thereof is $1 \times 10^{13}/cm^3$, the diffusion depth of the $p^+$-type layer 2a is 1.5 82 m and the surface impurity concentration thereof is $1 \times 10^{17}/cm^3$, the diffusion depth of the $p^{++}$-type layer 2b is 0.3 μm and the surface impurity concentration thereof is $1 \times 10^{19}/cm^3$, the diffusion depth of the $n^{++}$-type layer 6 is 0.4 μm and the surface impurity concentration thereof is $1 \times 10^{19}/cm^3$, and the diffusion depth of the $n^+$-type cathode layer 3 is 15 μm and the surface impurity concentration thereof is $1 \times 10^{20}/cm^3$.

It is preferable to set the sheet resistance ρ of a portion of the $p^+$-type layer 2a lying under the $n^{++}$-type layer 6 within a range of 500 Ω/□ < ρ < 20000 Ω/□. The widths d1 and d2 of the $p^{++}$-type layers 2b and $n^{++}$-type layers 6 which are disposed in the $p^{++}$-type layers 2b in a stripe pattern are so set as to satisfy the relation of d1 ≦ d2. Specifically, in this embodiment, d1=d2. It is preferable to set d1 < 15 μm by taking the current concentration at the time of reverse recovery into consideration. As a result, the degree of the breakdown voltage can be enhanced.

The distribution of carrier concentration in the $n^-$-type base layer 1 in the ON state (highly injected state) of the high breakdown voltage diode whose impurity concentration and dimension are determined as described above is shown together with that of the conventional case (broken lines) in FIG. 3D.

According to this embodiment, the p-type anode layer 2 is mainly formed of the $p^+$-type layer 2a whose impurity concentration is lower than that of the conventional case and the $n^{++}$-type layers 6 are formed as blocking layers for suppressing hole injection from the anode layer 2. Therefore, as shown in FIG. 3D, in the highly injected state, the distribution of carrier concentration in the $n^-$-type base layer 1 is $1 \times 10^{16}/cm^3$ on the cathode side but is approx. $1 \times 10^{15}/cm^3$ which is less than the former value by one digit (power of ten), on the anode side. Thus, since the carrier concentration in the $n^-$-type base layer 1 on the anode side becomes less, the reverse recovery characteristic can be improved.

Figure 4:
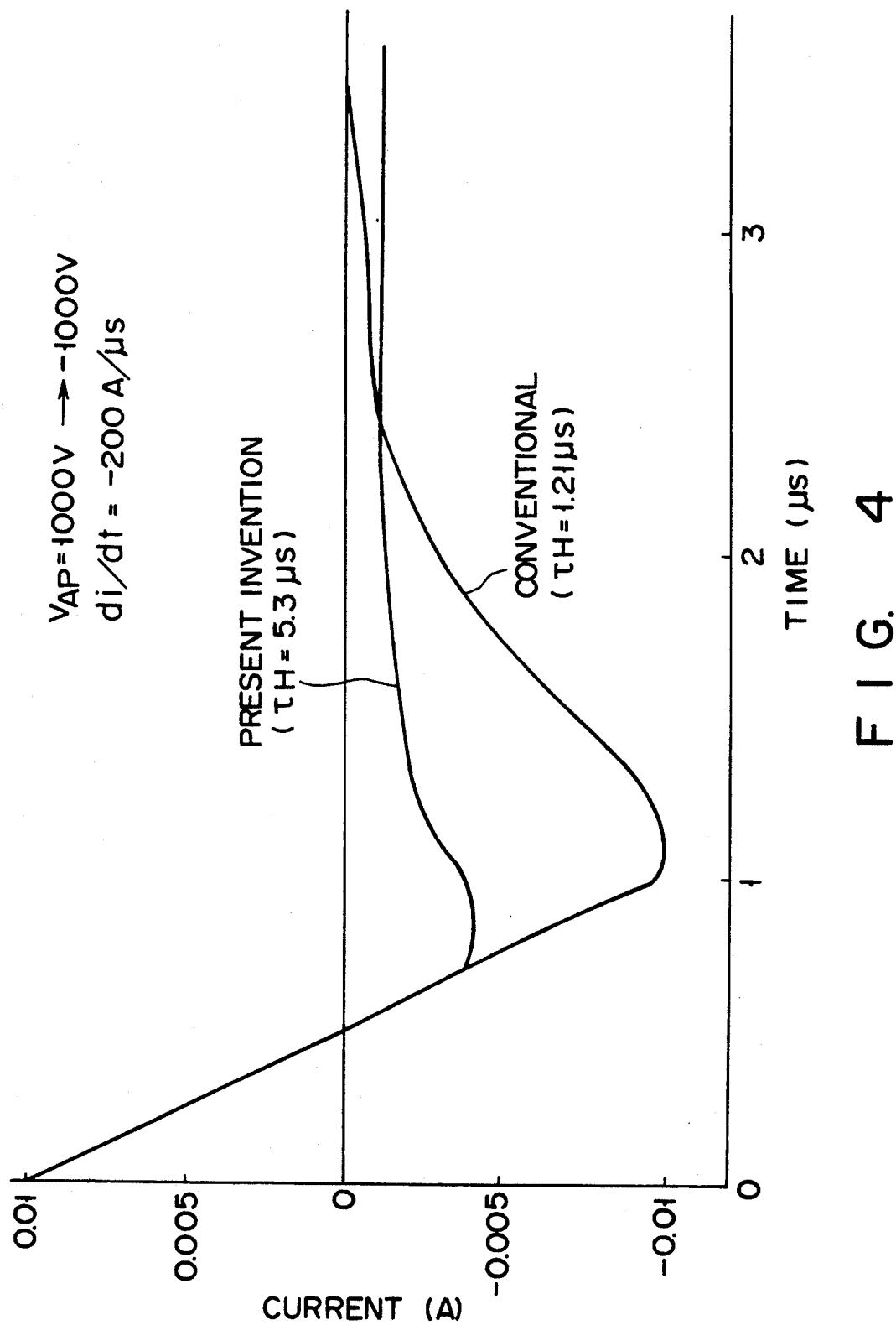
FIG. 4 is a diagram showing the reverse recovery characteristic of the element of FIG. 2A in comparison with the conventional case.

FIG. 4 shows the reverse recovery characteristic of the diode of this embodiment together with the conventional case for comparison. In this case, the waveform is obtained in a condition that the current density is 100 A/cm² (ON voltage of 2.6 V), an application voltage is 1000 V, and di/dt = −200 A/μ sec. The τH is a carrier lifetime in the n-type base layer 1.

Since the $n^{++}$-type layers 6 are formed in the anode layer 2 as the injection blocking layers, there is a possibility that the parasitic transistor effect may occur at the time of reverse recovery. The parasitic transistor effect may be caused when a reverse recovery current flows in a lateral direction in the $p^+$-type layer 2a of the anode layer 2 as shown in FIG. 5 and a voltage V between the $p^+$-type layer 2a and the $n^{++}$-type layer 6 causes a forward bias to be higher than the built-in voltage (0.5 V). Therefore, it is necessary to suppress the voltage V.

The voltage drop V in the lateral direction in the $p^+$-type layer 2a lying directly under the $n^{++}$-type layer 6 can be expressed by the following equation by use of the sheet resistance $\rho p^+$ of the $p^+$-type layer 2a lying directly under the $n^{++}$-type layer 6, the current density j flowing in the layer 2a and the width d1 of the $n^{++}$-type layer 6.

$$V = \rho p^+ (j/2)(d1^2/4)$$

If the voltage V is less than the built-in voltage of 0.5 V, the parasitic transistor of $n^{++}p^+n^-n^+$ will not operate and the switching loss can be reduced. The above equation indicates an equation for a case where the $n^{++}$-type layers 6 are formed in a stripe pattern.

The condition for preventing the operation of the parasitic transistor may be generalized and explained as follows by taking all of the possibilities of the dispersed arrangements of the $n^{++}$-type layers 6 and the $p^{++}$-type layer 2b into consideration.

The density of current flowing in the element is j [A/cm²], the sheet resistance of a portion of the $p^+$-type layer 2a lying directly under the $n^{++}$-type layer 6 is $\rho p^+$ (Ω/□), the set of points in the top surface region of the $n^{++}$-type layer 6 is A(a), and the set of points on a boundary between the top surface region of the $n^{++}$-type layer 6 and the top surface region of the $p^{++}$-type layer 2b is B(b). Further, the distance between any point a in the set A(a) and any point b in the set B(b) is defined as $d_{ab}$. When the point a is fixed within the set A(a) and the point b is changed within the set B(b), the minimum distance min $d_{ab}$ can be found. Next, if the point a is changed within the set A(a), many min $d_{ab}$ can be obtained. The distance D (cm) is defined as a maximum distance within the many min $d_{ab}$ thus obtained. The distance D (cm) is expressed as satisfying the equation of D=max (min $d_{ab}$).

If the shape of the n++-type layer 6 and the boundary between the n++-type layer 6 and the p++-type layer 2b are determined, the distance D is set. Assuming a junction voltage between the n++-type layer 6 and the p+-type layer 2a is V [volts], it is only necessary to satisfy the following expression:

$$V > \rho_{p^+} (j/2) D^2$$

In this case, (min $d_{ab}$) defines a direction in which a current tends to easily flow from a specific point a of the n++-type layer 6 to the boundary. The max (min $d_{ab}$) indicates the maximum distance in the direction in which the current may easily flow, that is, it corresponds to a voltage drop in the lateral direction in the p+-type layer 2a lying directly under the n++-type layer 6. Therefore, if the above equation is satisfied, the parasitic transistor will not operate.

Figure 6:
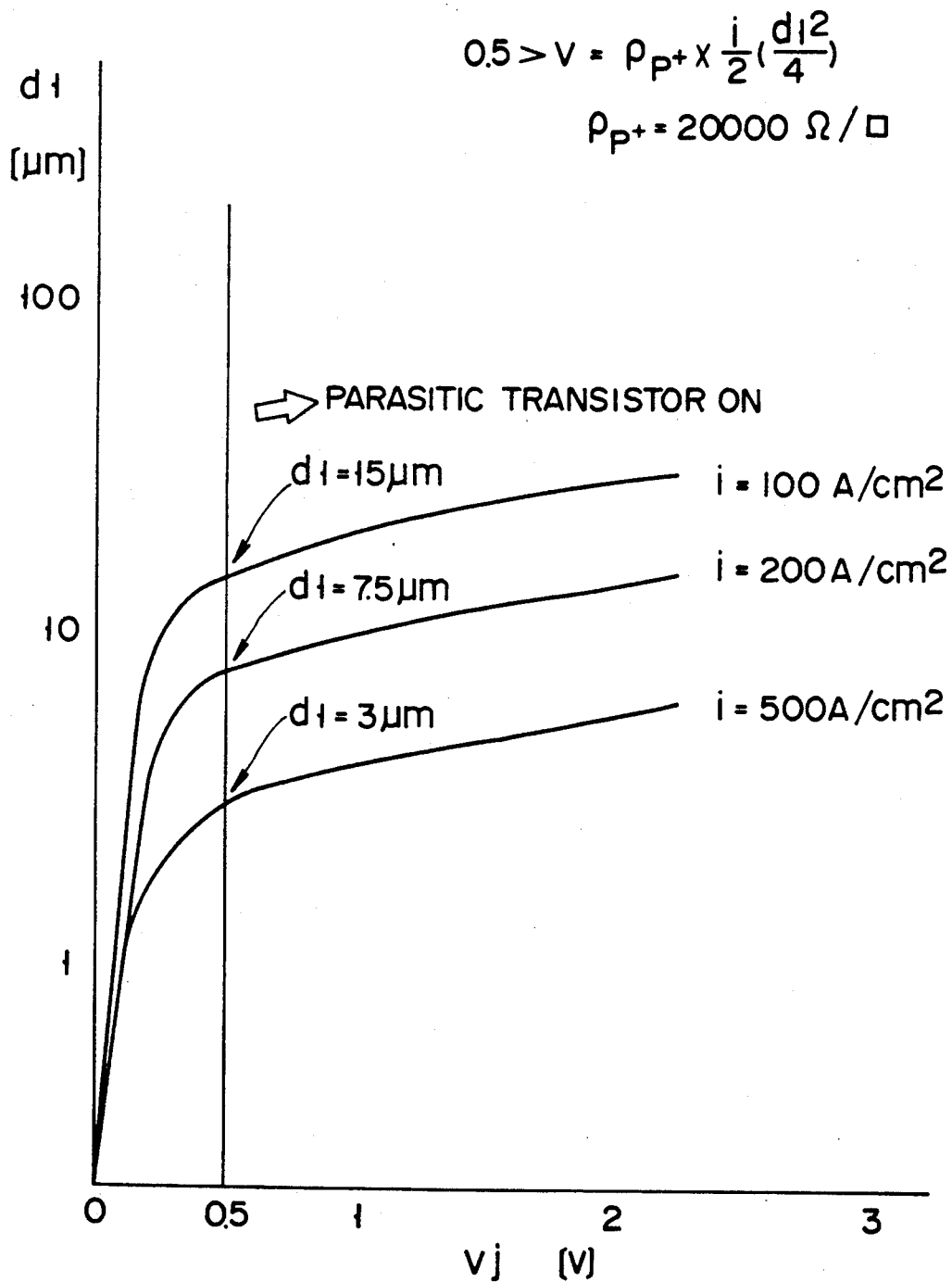
FIG. 6 is a diagram for illustration of a preferable conditional range for suppressing the parasitic transistor effect.

FIG. 6 shows the condition for operating the parasitic transistor by reference to the relation between the sheet resistance $\rho_{p^+}$ and the width d1 of the n++-type layer 6.

In a case where the sheet resistance of the p+-type 2a of the anode layer is 20,000 $\Omega/\square$ and the current density (which is the same as the maximum current value in a case where current concentration occurs) is 100 A/cm², d1=15 μm and Vj=0.5 V. Thus, it is necessary to satisfy the condition that d1<15 μm in order to suppress the parasitic transistor effect. When the current density is 200 A/cm², d1<7.5 μm must be satisfied, and when the current density is 500 /A/cm², d1<3 μm must be satisfied.

Further, when the element area is small and less current concentration occurs, d1 can be set to a relatively large value, but when the element area is large and the current concentration occurs, it is preferable to set d1 to a small value, for example, 3 μm or less.

Figure 7A:
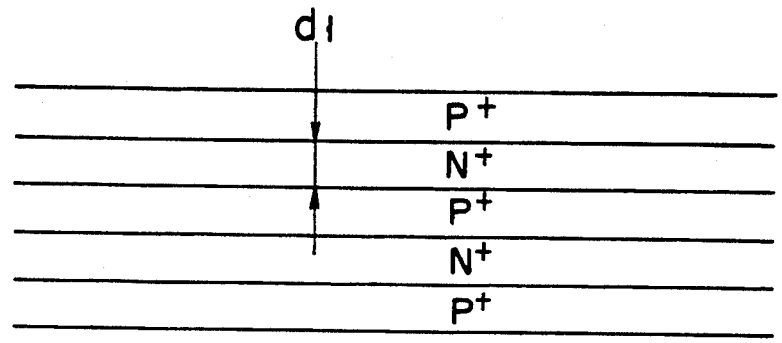
FIGS. 7A, 7B and 7C are diagrams showing examples of the cathode diffusion pattern of the element shown in FIG. 2A.
Figure 7B:
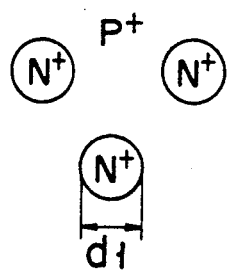
Figure 7C:
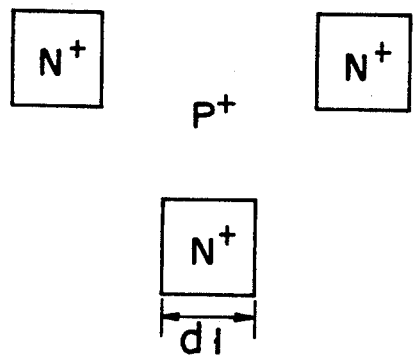
Figure 8A:
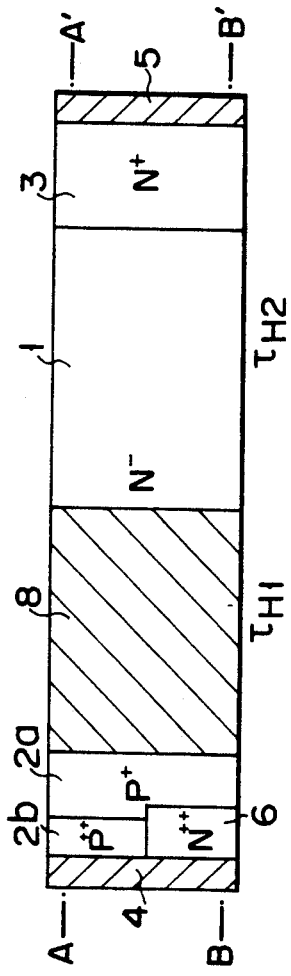
FIGS. 8A, 8B, 8C and 8D are a view and diagrams corresponding to those of FIGS. 3A, 3B, 3C and 3D and showing a diode according to another embodiment.
Figure 8B:
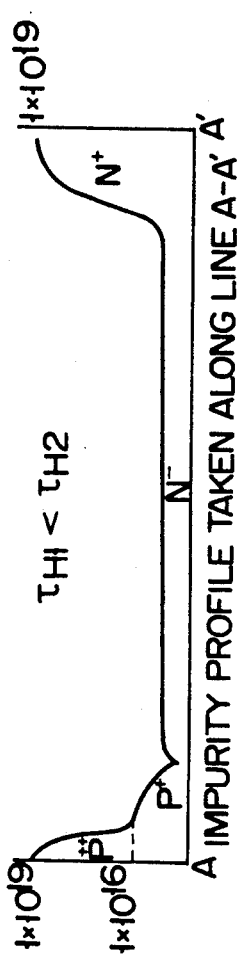
Figure 8C:
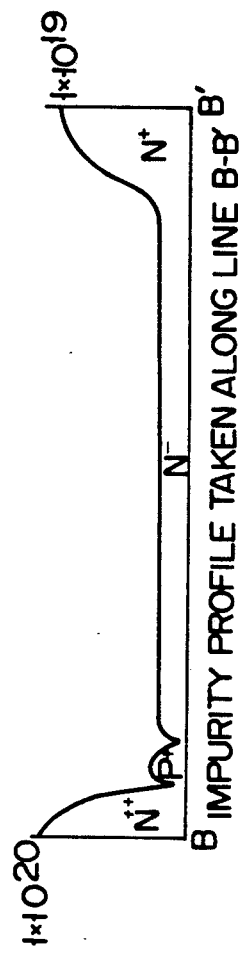
Figure 8D:
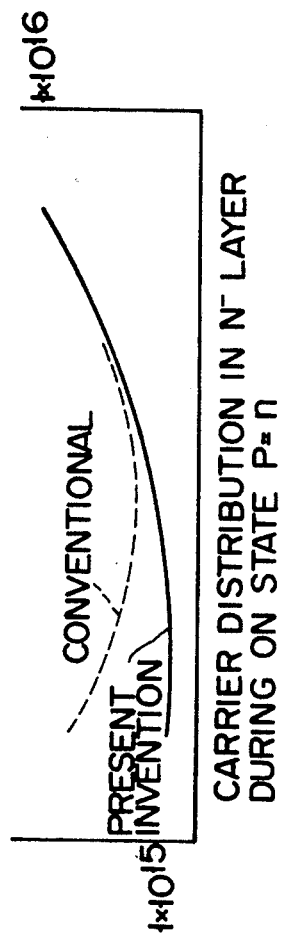
Figure 11A:
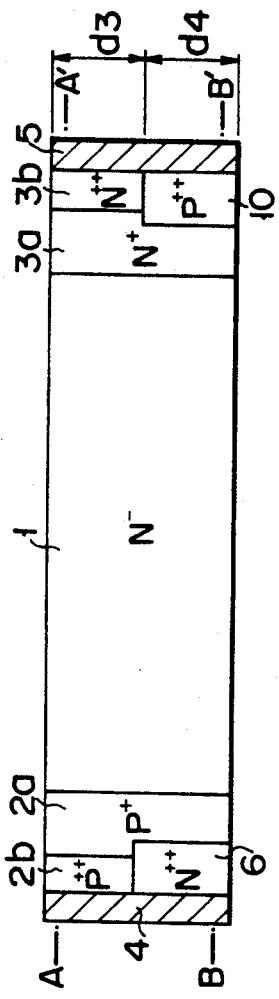
FIGS. 11A, 11B, 11C and 11D are a view and diagrams corresponding to those of FIGS. 3A, 3B, 3C and 3D and showing a diode according to still another embodiment.
Figure 11B:
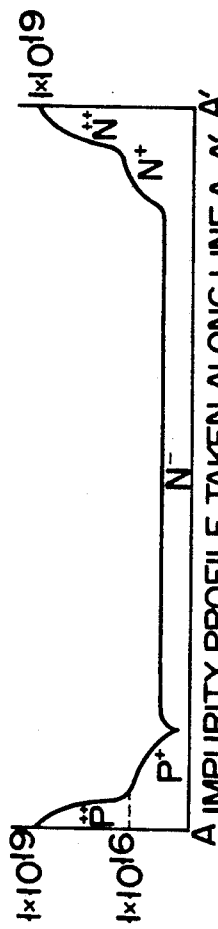
Figure 11C:
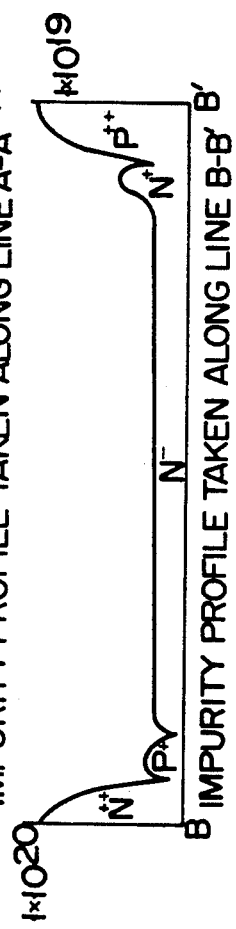
Figure 11D:
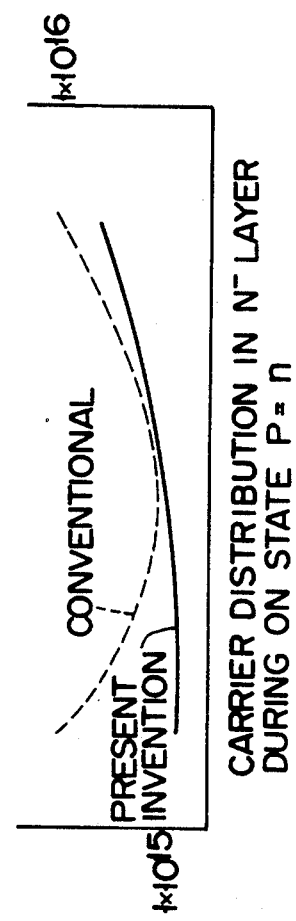

Some examples of the relations between the n++-type layer 6 and the width d1 are shown in FIGS. 7A, 7B and 7C. When any one of the patterns is selected, it is important to suppress the parasitic transistor effect by taking the above-described conditions into consideration.

FIGS. 8A to 8D respectively show the construction of a main portion of a high breakdown voltage diode according to another embodiment, the distributions of impurity concentration and the distribution of carrier concentration in the ON state of the diode correspond to FIGS. 3A to 3D of the former embodiment.

FIGS. 9A to 9D respectively show the construction of a main portion of a high breakdown voltage diode according to still another embodiment, the distributions of impurity concentration and the distribution of carrier concentration in the ON state of the diode correspond to FIGS. 3A to 3D of the former embodiment.

FIGS. 10A to 10D respectively show the construction of a main portion of a high breakdown voltage diode according to another embodiment, the distributions of impurity concentration and the distribution of carrier concentration in the ON state of the diode correspond to FIGS. 3A to 3D of the former embodiment.

FIGS. 11A to 11D respectively show the construction of a main portion of a high breakdown voltage diode according to another embodiment, the distributions of impurity concentration and the distribution of carrier concentration in the ON state of the diode correspond to FIGS. 3A to 3D of the former embodiment.

In the embodiment of FIGS. 8A to 8D, a life time killer is selectively injected into a portion of the n⁻-type base layer 1 on the anode side to form a low carrier life time region 8. The life time control can be easily effected by use of the technique such as irradiation of H⁺ or He⁺, for example. The critical back power at the time of reverse recovery can be enhanced by forming the low carrier life time region 8. The $\tau H1$ is a carrier life time in the low carrier life time region 8, and $\tau H2$ is a carrier life time in the n⁻-type base layer 1.

In the embodiment of FIGS. 9A to 9D, a low carrier life time region 8 is formed in a portion of the n⁻-type base layer 1 on the cathode side in the same manner as in the former embodiment.

Unlike the embodiment of FIGS. 8A to 8D, in the region 9 is selectively formed in a region directly under the p++-type layer 2b.

In the embodiment of FIGS. 11A to 11D, carrier injection blocking layers 10 are formed in portions on the anode and cathode sides. That is, the cathode layer 3 has a double-layered structure formed of an n+-type layer 3a and n++-type layers 3b of higher impurity concentration and the n++-type layers 3b is dispersedly arranged in the cathode side. The width d3 of the n++-type layer 3b and the width d4 of the p++-type layer 10 are substantially equal to each other (d3≈d4).

According to this embodiment, the carrier concentration of the n⁻-type base layer 1 in the highly injected state becomes lower on the anode and cathodes sides than that of the conventional case, and consequently, the reverse recovery characteristic can be further improved.

Figure 14:
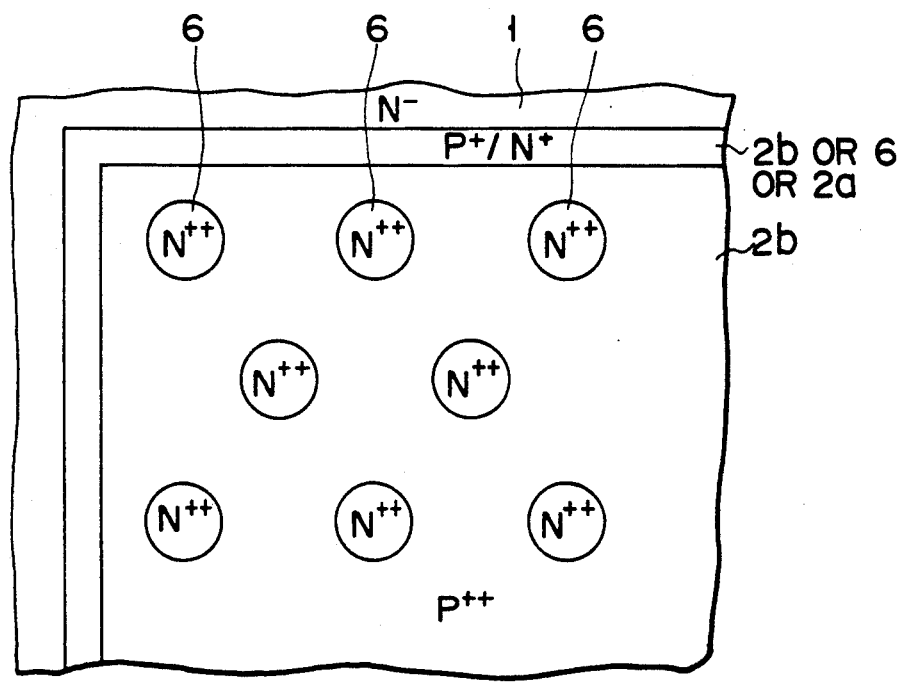
FIG. 14 is a diagram corresponding to that of FIG. 2A and showing still another example of an anode side diffusion pattern.

In the above embodiments, the high impurity concentration layers serving as the current blocking layers, for example, n++-type layers 6 in the embodiment of FIGS. 2A and 2B, are disposed in a stripe pattern in the p++-type layer 2b, but this pattern can be variously modified. Examples of the pattern are shown in FIGS. 12 to 14 in the same manner as in FIG. 2A.

In the modification of FIG. 12, after the n++-type layer 6 is formed by diffusion in the anode layer 2, a plurality of p++-type layers 2b are dispersedly formed by diffusion in the layer 6. Like the embodiment of FIG. 2A, in the modifications of FIGS. 13 and 14, after the p++-type layer 2b is formed by diffusion, a plurality of n++-type layers 6 are formed by diffusion not in a stripe pattern but in a dispersed pattern.

This invention can be applied to a diode in which structure the high breakdown voltage is attained in the junction end portion Such embodiments are described below.

FIG. 15 shows an embodiment in which p+-type guard ring layers 11a and 11b are formed outside the p-type anode layer 2. An n+-type layer 12 for potential fixation is formed outside the guard ring layers 11a and 11b. In this embodiment, n++-type layers 6 serving as the current blocking layers on the anode side are selectively formed near the junction end portion. Like the portion on the anode side, a portion on the cathode side has a double-layered structure formed of an n+-type layer 3a and an n++-type layer 3b, and p++-type layers 10 serving as the current blocking layers are formed in the double-layered structure.

Figure 16:
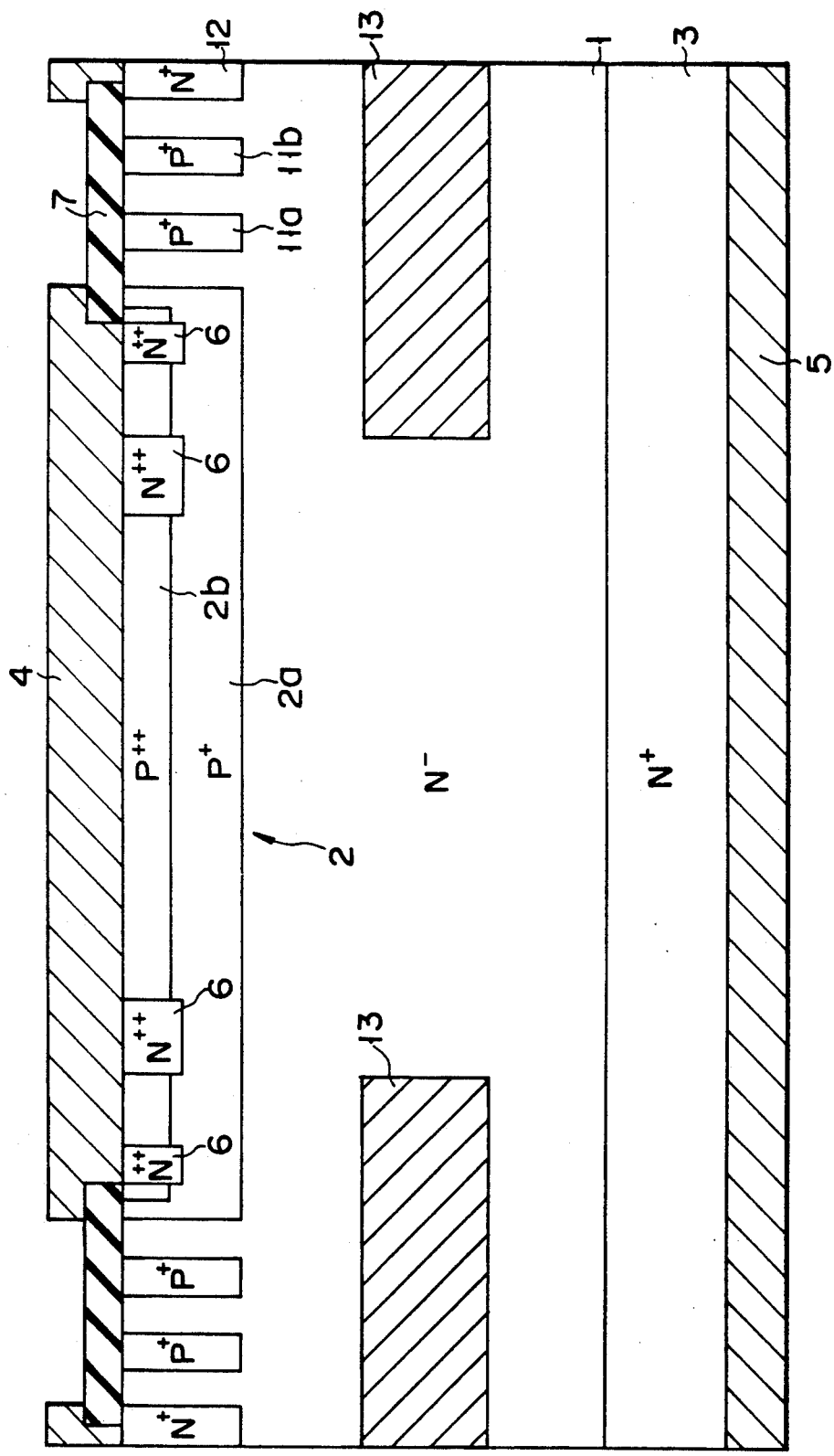
FIG. 16 is a cross sectional view of a diode according to an embodiment in which a low carrier life time region is formed in the structure of FIG. 15.

FIG. 16 shows an embodiment in which p+-type guard ring layers 11a and 11b are formed outside the p-type anode layer 2, and at the same time, a low carrier life time region 13 is formed in a portion of the n−-type base layer 1 near the junction end portion.

Figure 17:
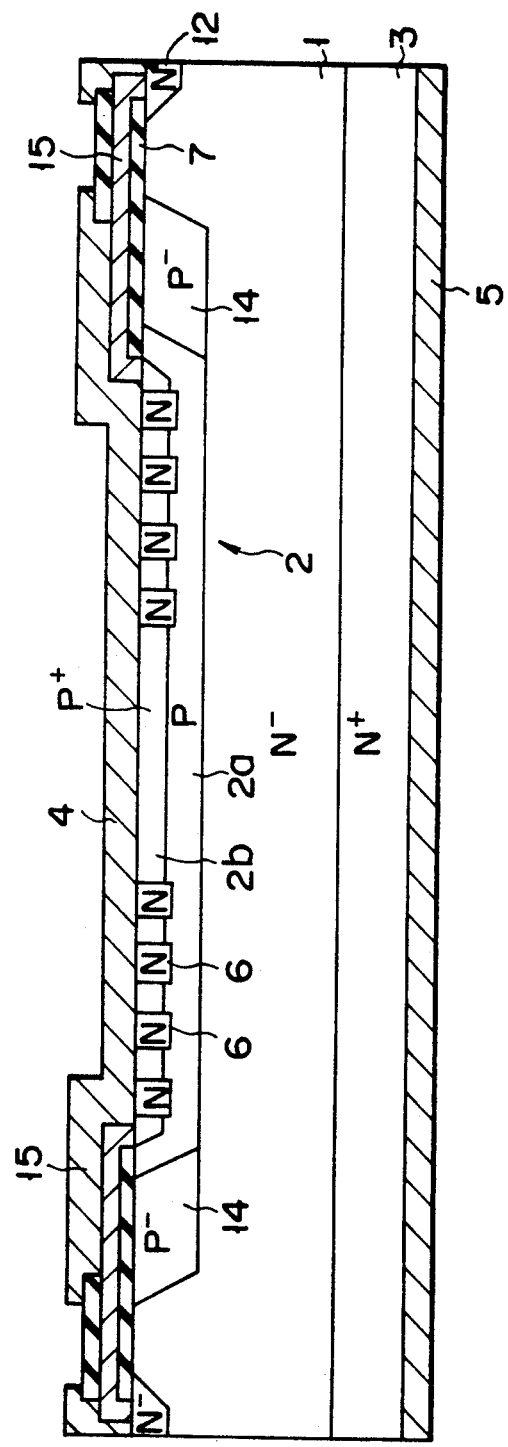
FIG. 17 is a cross sectional view of a diode according to an embodiment of a junction end portion having a resurface layer and a high-resistance film.

FIG. 17 shows an embodiment in which a p−-type resurf layer 14 is formed outside the p-type anode layer 2 and a high-resistance film 15 such as SIPOS is formed over the resurf layer 14 and the surrounding portion thereof with an oxide film 7 disposed therebetween. One end of the high-resistance film 15 is connected to the anode layer 2 and the other end thereof is connected to an n+-type layer 12 formed apart from the anode layer by a preset distance in the n−-type base layer.

Figure 18:
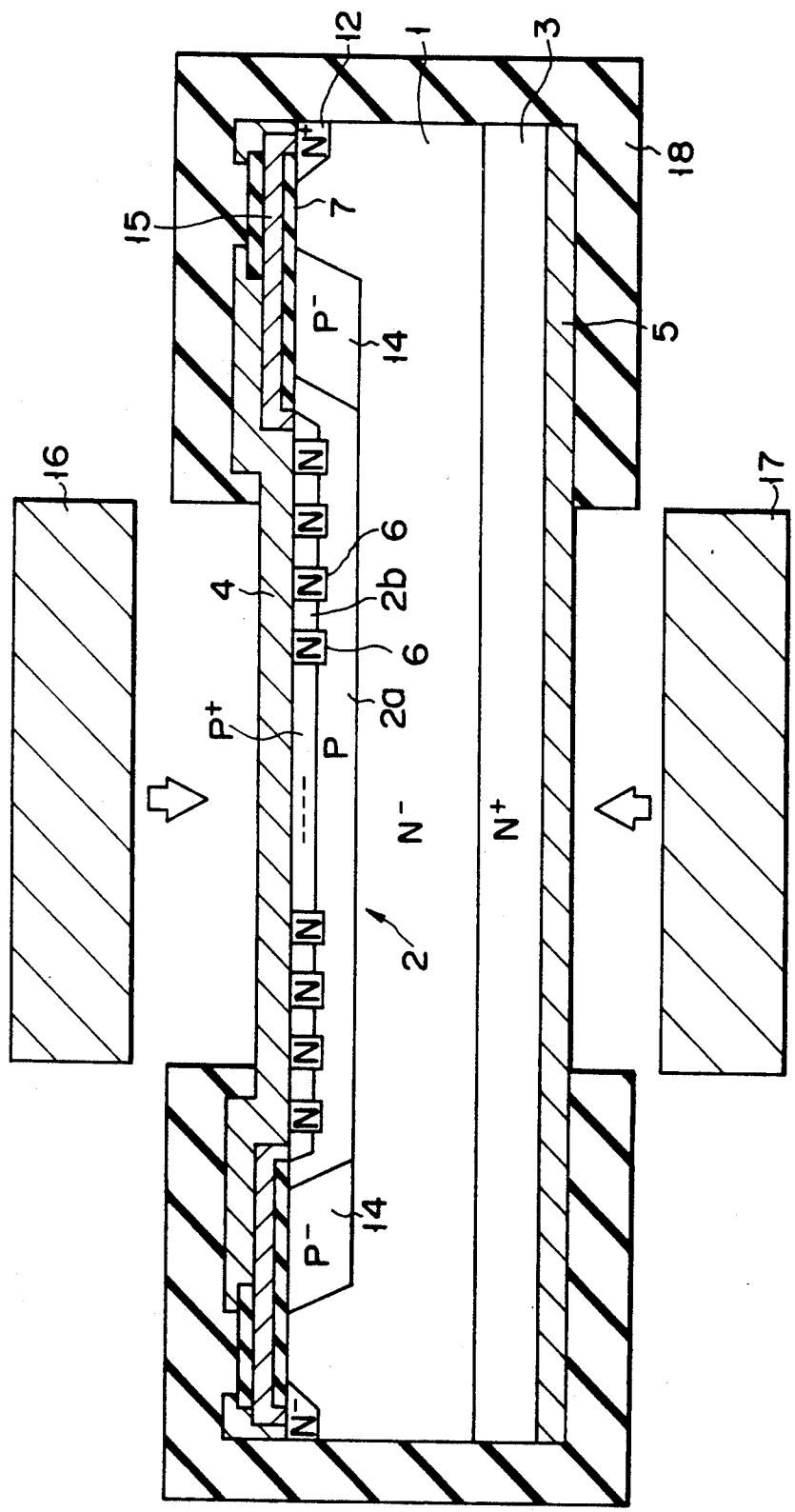
FIG. 18 is a cross sectional view of a diode according to an embodiment of a bonded contact structure.

FIG. 18 shows an embodiment in which the structure of FIG. 17 is used as a basic structure and boding electrodes 16 and 17 are formed thereon. A portion outside the region to which the bonding electrodes 16 and 17 are bonded is covered with an insulation film 18 formed of polyimide, encapped silicone rubber, for example.

Figure 19:
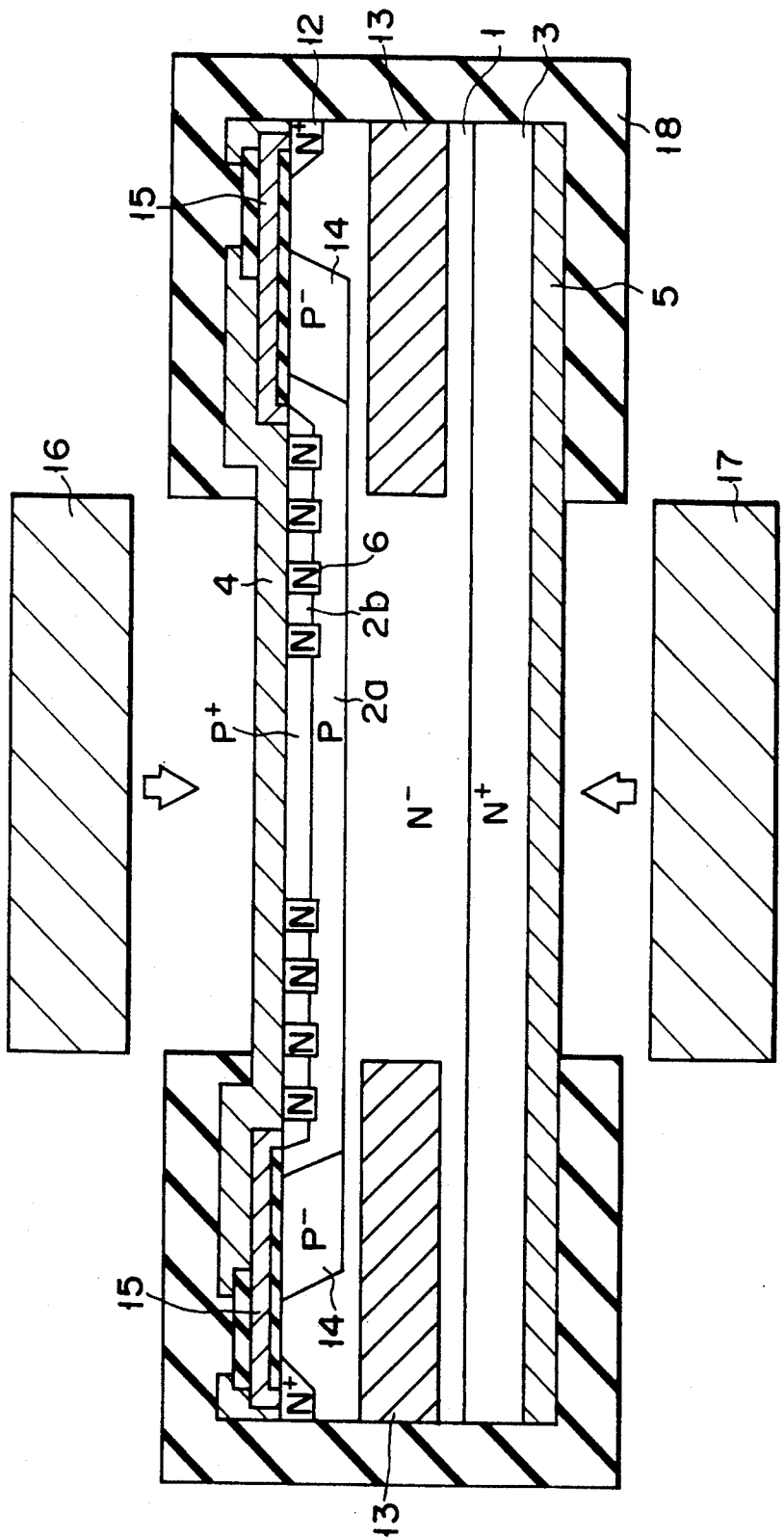
FIG. 19 is a cross sectional view of a diode according to an embodiment in which a low life time carrier region is formed in the structure of FIG. 18.

FIG. 19 shows an embodiment in which a low carrier life time region 13 is additionally formed in the n−-type base layer 1 in the embodiment of FIG. 18.

The above-described embodiments relate to the high breakdown voltage diode, but this invention can also be applied to other elements having a similar pn junction portion. Such an embodiment is described below.

Figure 20:
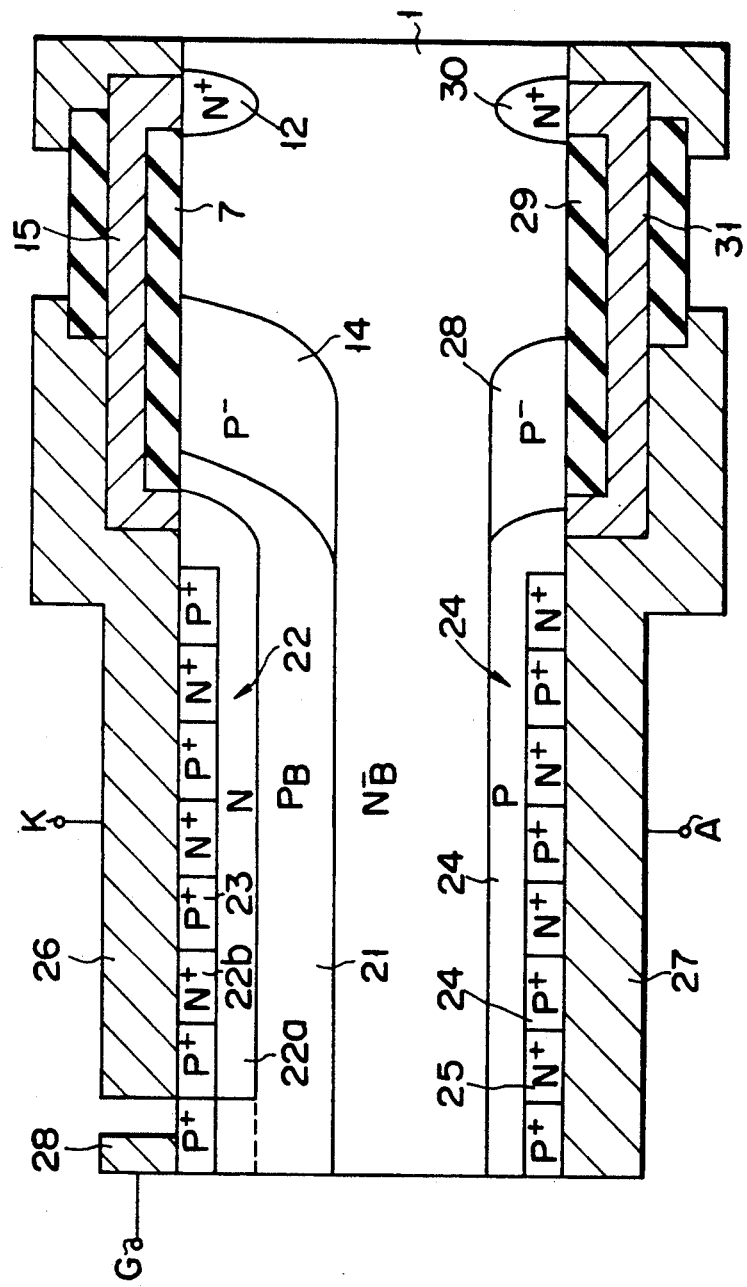
FIG. 20 is a cross sectional view of a thyristor according to an embodiment of this invention.

FIG. 20 shows an embodiment of a thyristor. A p-type base layer 21 is formed in an n−-type base layer 1 and an n-type emitter layer 22 is formed in the p-type base layer 21. The n-type emitter layer 22 has an n-type layer 22a and a plurality of n+-type layers 22b serving as high impurity concentration contacts, for example, formed in the n-type layer 22a, and p+-type layers 23 serving as current blocking layers are each formed between the n+-type layers 22b.

A p-type emitter layer 24 is formed in the other side of the n−-type base layer 1. In this embodiment, the same structure as that on the cathode side is used in the p-type emitter layer 24. That is, the p-type emitter layer 24 is constructed by a p-type layer 24a and a plurality of p+-type layers 24b of high impurity concentration dispersedly formed in the layer 24a, and n+-type layers 25 serving as current blocking layers are each formed between the p+-type layers 24b.

FIGS. 21A and 21B show examples of the respective diffusion patterns on the cathode and anode sides of the thyristor of this embodiment.

A cathode electrode 26 which is disposed in contact with the p+-type layer 23 is formed in contact with the n-type emitter layer 22, and anode electrode 27 which is disposed in contact with the n+-type layer 25 is formed in contact with the p-type emitter layer 24. A gate electrode 28 is formed in contact with the p-type base layer 21.

Like the former embodiment of FIG. 17, a p−-type resurf layer 14 is formed on the end portion of the p-type base layer 21 and a high-resistance film 15 is formed over the layer 14 with an insulation film 7 disposed therebetween. One end portion of the high-resistance film 15 is connected to the n-type emitter layer 22 and the other end portion thereof is connected to an n+-type layer 12 for potential fixation formed in the n-type base layer 1. Also, on the anode side, a p−-type resurf layer 28 is formed on the end portion of the p-type emitter layer 24 and a high-resistance film 31 is formed over the layer 28 with an insulation film 29 disposed therebetween. One end portion of the high-resistance film 31 is connected to the p-type emitter layer 24 and the other end portion thereof is connected to an n+-type layer 30 for potential fixation formed in the n-type base layer 1.

According to this embodiment, excessive carrier injection can be suppressed on the anode and cathode sides and carrier accumulation in a portion near the anode and cathode electrodes in the ON state can be reduced. Further, on the cathode side, the operation of the pnp parasitic transistor can be prevented by satisfying the same condition as is set in the former embodiment by formation of the n+-type 22a and p+-type layer 23. Also, on the anode side, the operation of the pnp parasitic transistor can be prevented in the same manner by formation of the p+-type layer 24b and n+-type layer 25. Thus, the turn-off characteristic of the thyristor can be improved.

Figure 22:
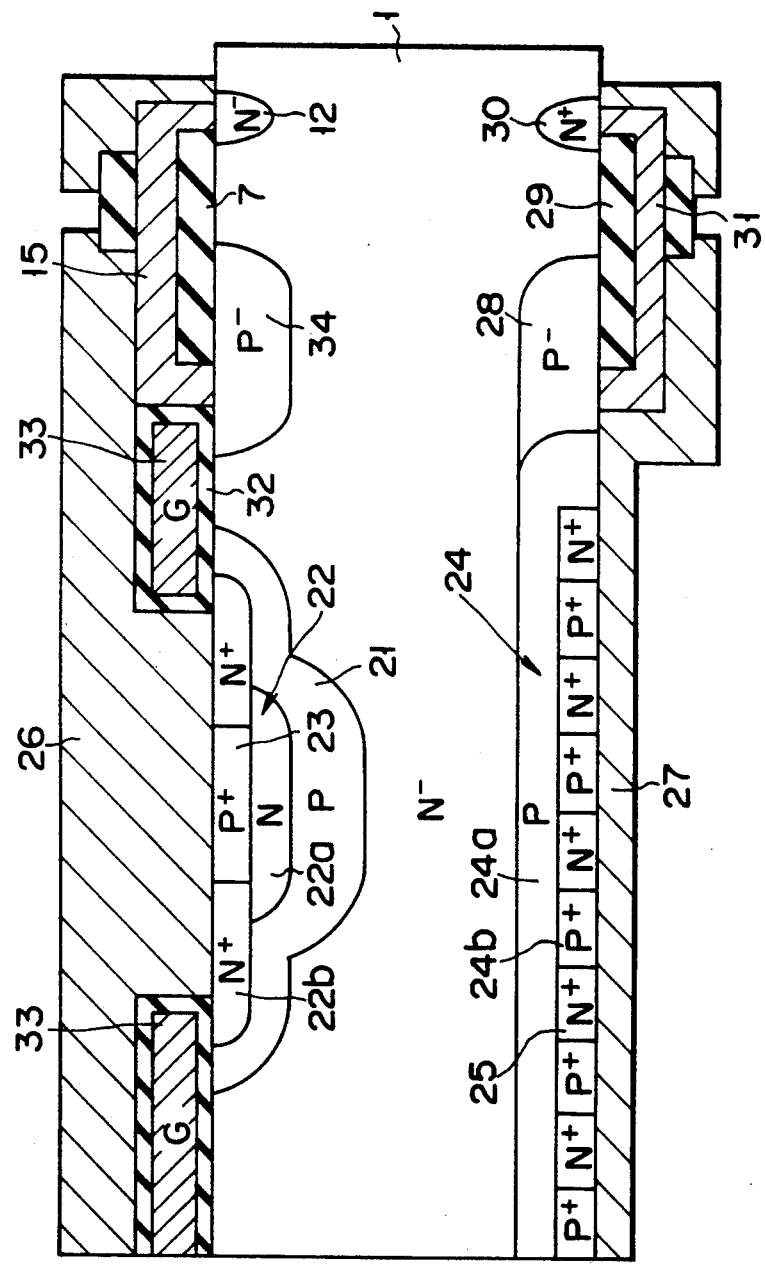
FIG. 22 is a cross sectional view of a thyristor with a MOS gate according to an embodiment of this invention.

FIG. 22 shows an embodiment in which this invention is applied to a thyristor having a turn-on MOS gate. A p-type base layer 21 is selectively formed in the n−-type base layer 1 and n-type emitter layer 22 is formed in the base layer 21. The n-type emitter layer 22 is constructed by an n-type layer 22a serving as the main body of the emitter and n+-type layers 22b of high impurity concentration formed in the layer 22a and a p+-type layer 23 serving as a current blocking layer is formed between the n+-type layers 22b. Gate electrodes 33 are formed over the exposed surface portions of the p-type base layer 21 which lie between the n-type emitter layer 22 and the n−-type base layer 1 with a gate insulation film 32 disposed therebetween.

p−-type layer 34 is formed outside the p-type base layer 21 to be partly overlapped with the gate electrode 33. A high-resistance film 15 is formed outside the layer 21 and on an insulation film 7. One end portion of the high-resistance film 15 is connected to the p−-type layer 34 and the other end portion thereof is connected to an n+-type layer 12 for potential fixation.

The anode side structure is the same as that of the former embodiment of FIG. 20.

In the element of this embodiment, a voltage which is positive with respect to the cathode is applied to the gate electrode 33 at the turn-on time. Therefore, electrons are injected from the n-type emitter layer 22 into the n−-type layer 1 via the channel under the gate electrode 33. At the turn-off time, the gate electrode is set to a potential equal to or less than that of the cathode. The element is turned off by discharging holes towards the cathode by means of a gate electrode which is not shown in FIG. 22.

Like the thyristor of the former embodiment, in this embodiment, a high-speed turn-off operation can be attained with less power loss by suppressing the excessive carrier accumulation and the parasitic transistor effect.

Figure 23:
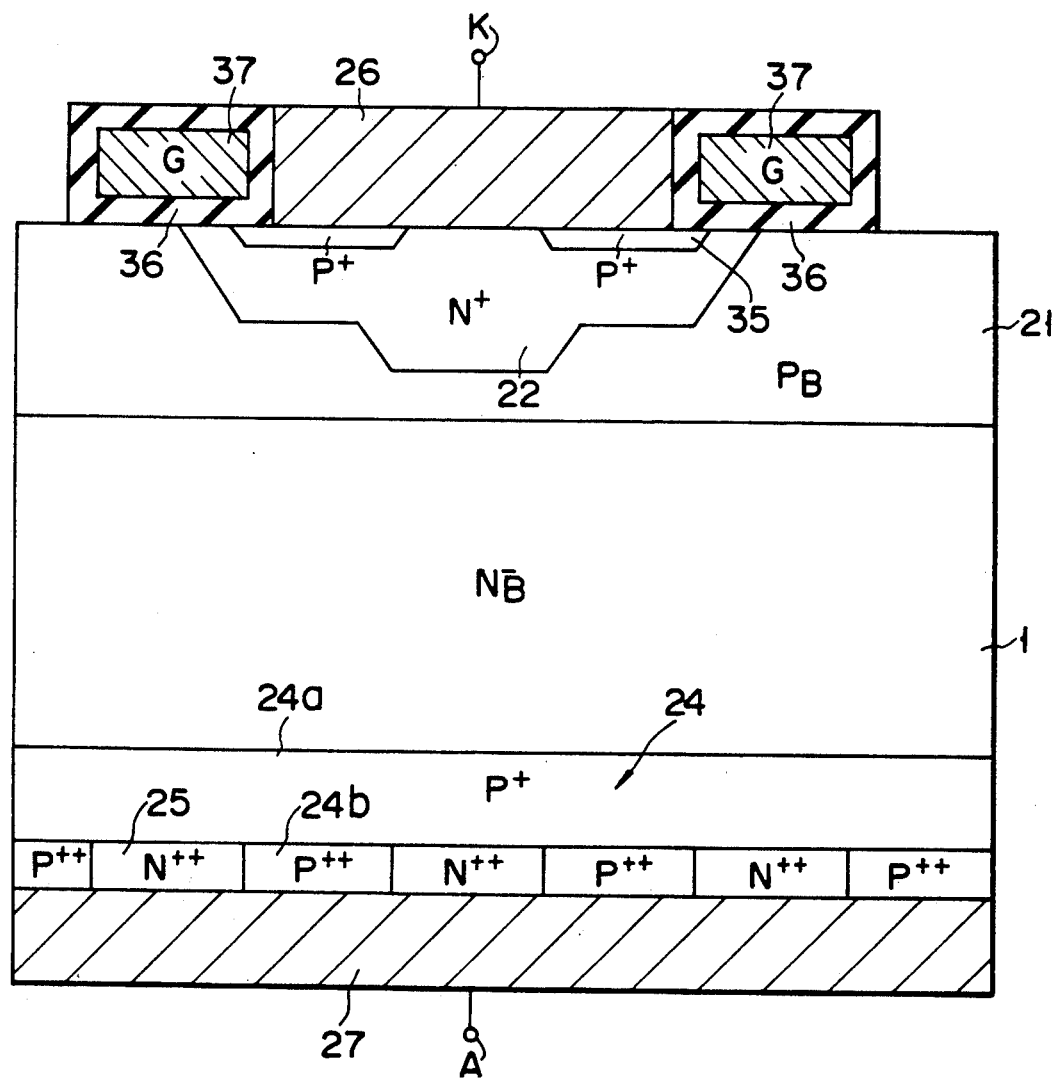
FIG. 23 is a cross sectional view of a thyristor with a MOS gate according to another embodiment.

FIG. 23 shows an embodiment in which this invention is applied to a thyristor having a turn-off MOS gate. In this embodiment, an n-type emitter layer 22 is formed in the p-type base layer 21 and p+-type source layers 35 are selectively formed in the end portion of the n-type emitter layer 22. Gate electrodes 37 are formed over the exposed surface portions of the n-type emitter layer 22 which lie between the p+-type source layer and the p-type base layer 21 with a gate insulation film 36 disposed therebetween. A turn-on gate section is not shown in the drawing.

The anode side structure is the same as that of the former embodiment.

The element of this embodiment is turned on by supplying a base current via a gate electrode which is not shown. At the turn-off time, a voltage which is negative with respect to the cathode is applied to the gate electrode 37. Therefore, holes in the n⁻-type base layer 1 are discharged from the p⁺-type source layer 35 to the cathode electrode 26 via the p-type base layer 21 and the channel under the gate electrode 37.

In this embodiment, the same effect as that of the former embodiment can be attained.

Figure 24:
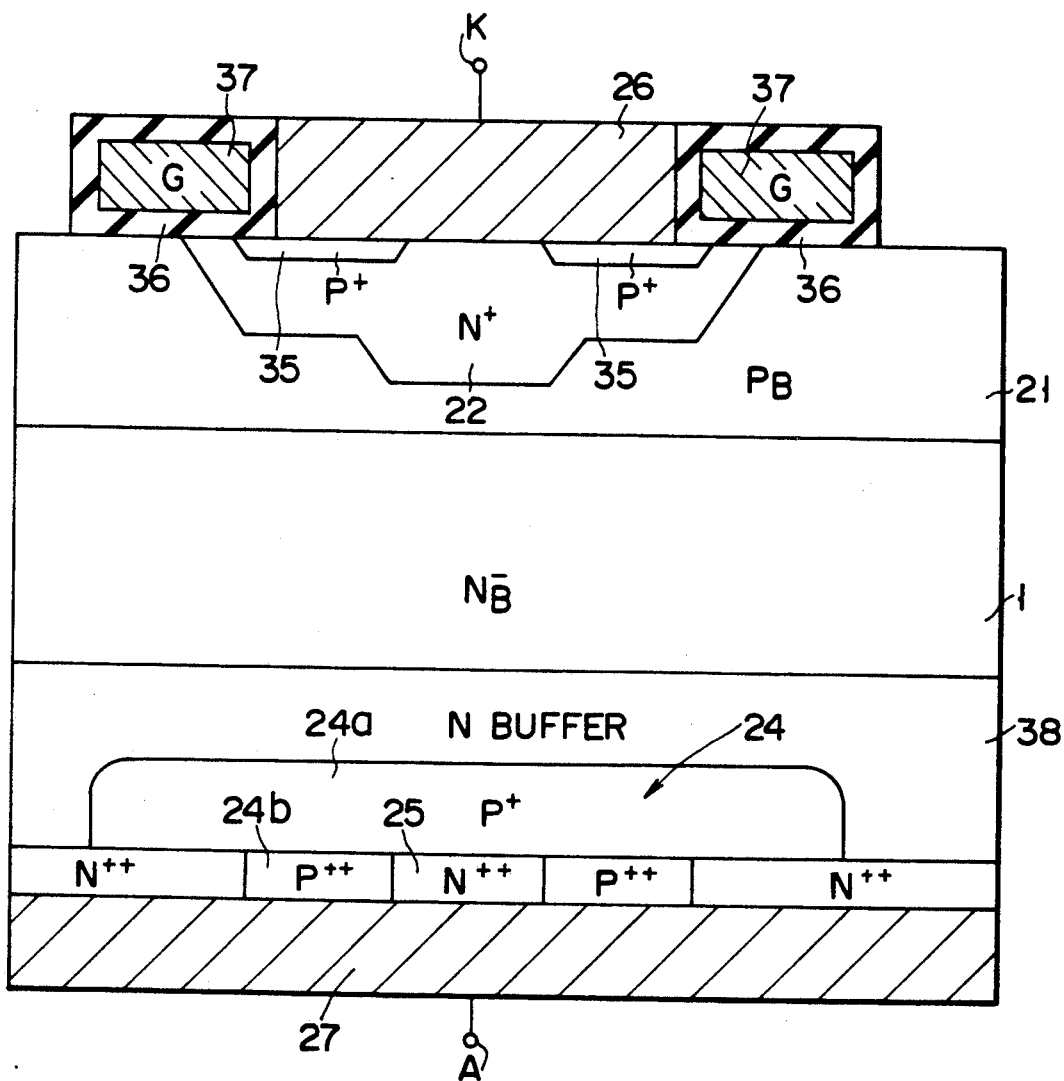
FIG. 24 is a cross sectional view of a modification of the structure shown in FIG. 23.

FIG. 24 shows an embodiment obtained by modifying the embodiment of FIG. 23. In this embodiment, an n-type buffer layer 38 is formed on the anode side of the n⁻-type base layer 1 and the anode structure having current blocking layers like the former embodiment is formed in the n-type buffer layer 38. The anode side section is formed to have an emitter short-circuiting structure.

Also, in this embodiment, the same effect as that in the former embodiment can be obtained.

Figure 25:
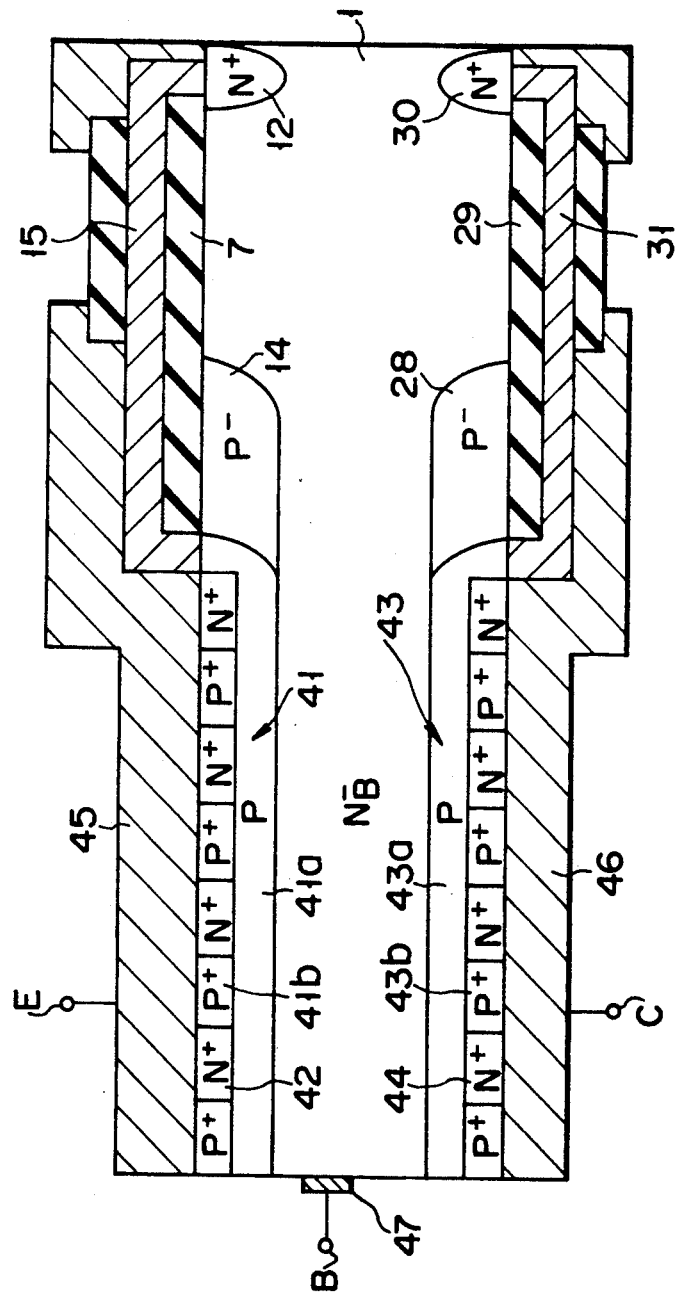
FIG. 25 is a cross sectional view of a bipolar transistor according to an embodiment of this invention.

FIG. 25 shows an embodiment in which this invention is applied to a bipolar transistor. A p-type emitter layer 41 is formed in the n⁻-type base layer 1 and a p-type collector layer 43 is formed in the other side thereof. The p-type emitter layer 41 is constructed by a p-type layer 41a and p⁺-type layers 41b of high impurity concentration dispersedly formed in the layer 41a, and n⁺-type layers 42 serving as current blocking layers are each formed between the p⁺-type layers 41b. The p-type collector layer 43 is constructed by a p-type layer 43a and p⁺-type layers 43b of high impurity concentration dispersedly formed in the layer 43a, and n⁺-type layers 44 serving as current blocking layers are each formed between the p⁺-type layers 43b.

An emitter electrode 45 is formed on the p-type emitter layer 41, a collector electrode 46 is formed on the p-type collector layer 43 and a base electrode 47 is formed on the n⁻-type layer 1.

The same structures as those of the embodiments of FIGS. 20 and 22 for attaining the high breakdown voltage are formed in the end portion of the p-type emitter layer 41 and the p-type collector layer 43.

Also, in this embodiment, the reverse recovery characteristic can be improved.

Figure 26:
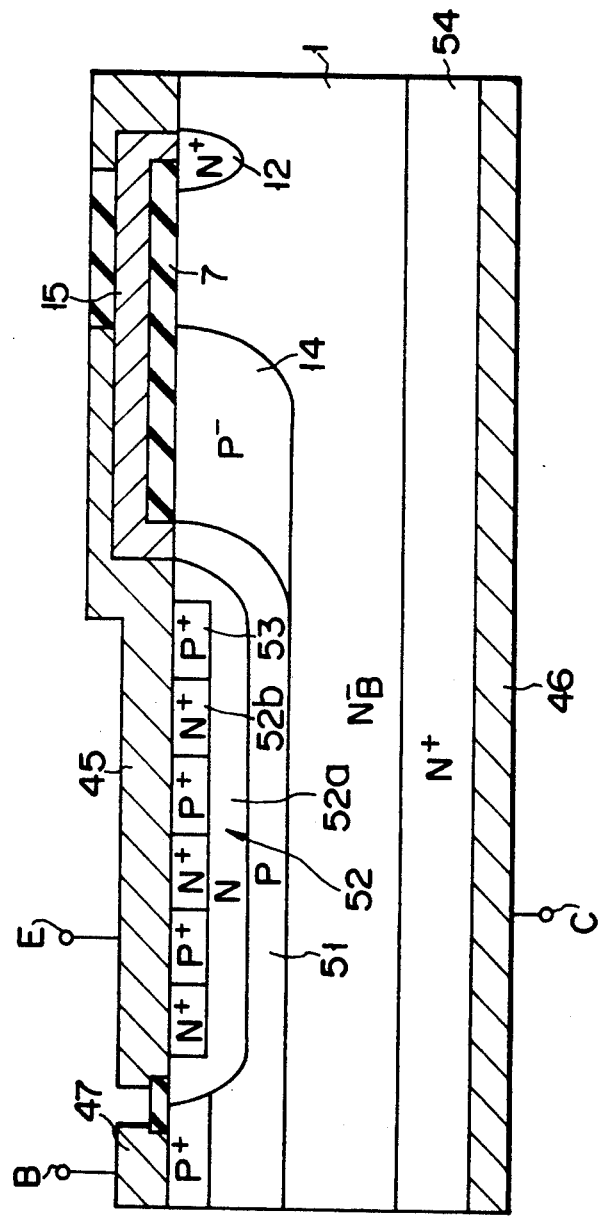
FIG. 26 is a cross sectional view of a bipolar transistor according to another embodiment.

FIG. 26 shows an embodiment in which this invention is applied to a bipolar transistor. In this embodiment, a planar structure is utilized in which an n⁻-type base layer 1 is used as a high-resistance collector layer. That is, a p-type base layer 51 is formed by diffusion in the n⁻-type base layer 1, and an n-type emitter layer 52 is formed by diffusion in the p-type base layer 51. The n-type emitter layer 52 is constructed by an n-type layer 52a and n⁺-type layers 52b of high impurity concentration dispersedly formed in the layer 52a, and p⁺-type layers 53 serving as current blocking layers are each formed between the n⁺-type layers 52b.

An emitter electrode 45 is formed in contact with both of the p⁺-type layer 53 and the n⁺-type layer 52b. An n⁺-type collector layer 54 is formed on the entire portion of the other surface of the n⁻-type base layer 1, and a collector electrode 46 is formed on the collector layer. A base electrode 47 is formed on the p-type base layer 51.

The same structure as that of the former embodiment for attaining the high breakdown voltage is formed in the end portion of the p-type base layer 51.

Also, in this embodiment, an excellent reverse recovery characteristic can be attained.

Figure 27:
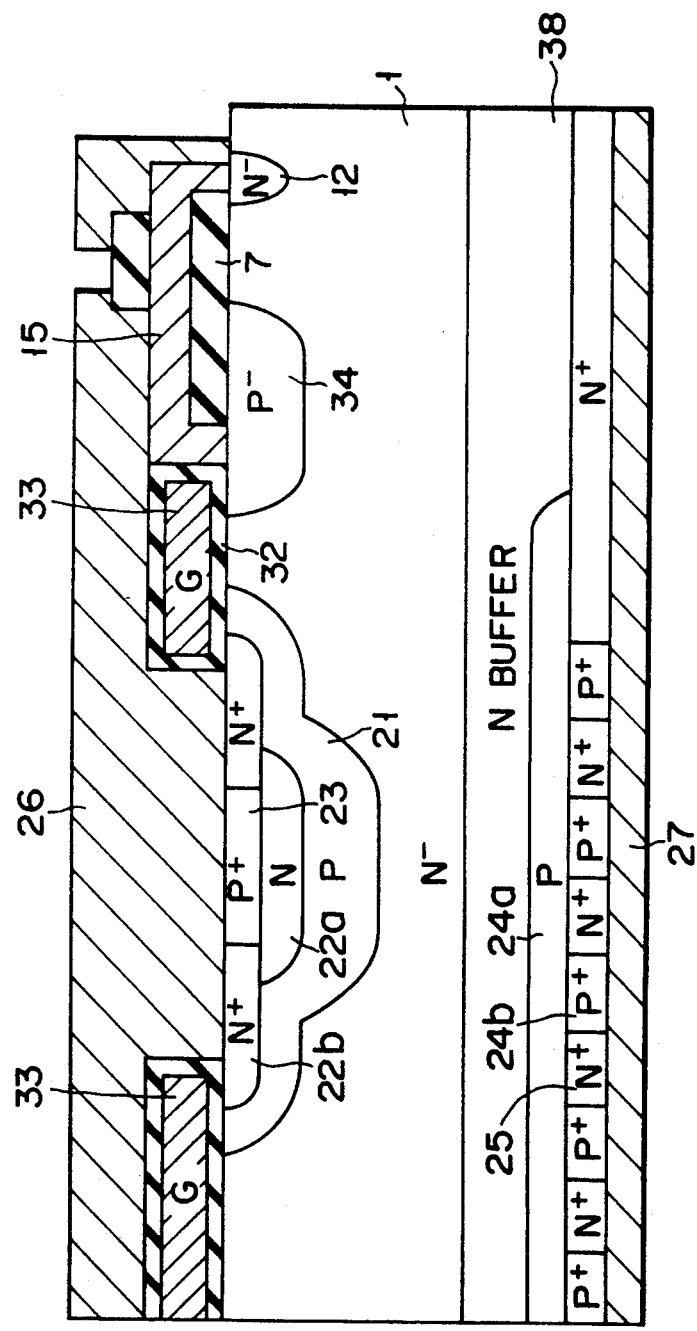
FIG. 27 is a cross sectional view of an IGBT according to an embodiment of this invention.

FIGS. 27 and 28 show embodiments in which this invention is applied to a pn junction portion on the anode side of an IGBT having a junction end portion of the main junction which lies in the same plane as the cathode side electrode.

Such a pn junction portion (guard ring, resurf, resistive field plate, field plate or the like) has a limitation of the breakdown voltage which is equal to approx. 70 to 90% of the theoretical breakdown voltage of the high-resistance base layer. Therefore, in order attain a desired breakdown voltage, it is necessary to set the impurity concentration of the high-resistance layer to be lower than that of a normal element (for example, an element having the bevel structure). The trade-off of the turn-off loss and ON-resistance deteriorated by the above impurity concentration setting can be improved by inserting the n-type buffer layer 38 and using the structure of this invention. That is, the trade-off of the turn-off loss and ON-resistance deteriorated by use of the above impurity concentration can be improved when applying this invention to any type of element (such as MCT, IGBT, EST and GTO) having the above-described junction end portion.

Figure 29A:
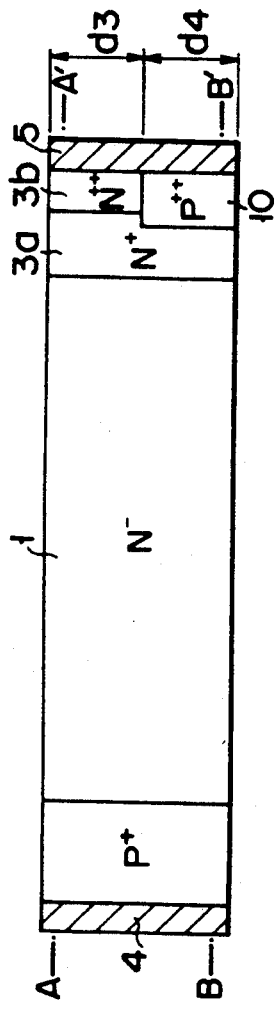
FIGS. 29A, 29B, 29C and 29D are a view and diagrams corresponding to those of FIGS. 3A, 3B, 3C, and 3D and showing a diode according to still another embodiment.
Figure 29B:
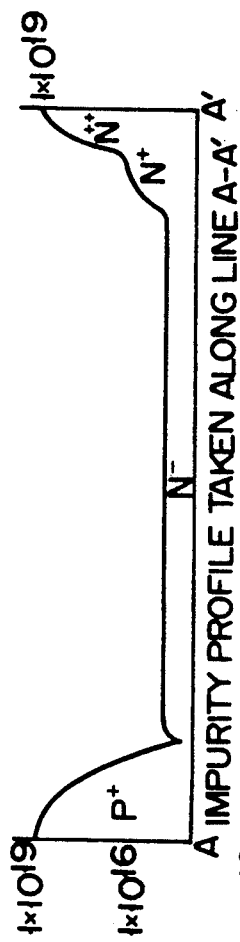
Figure 29C:
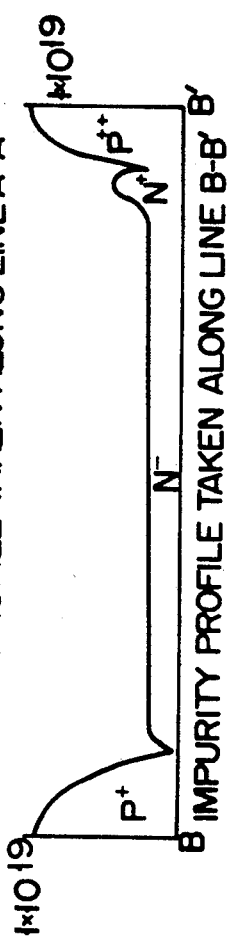
Figure 29D:
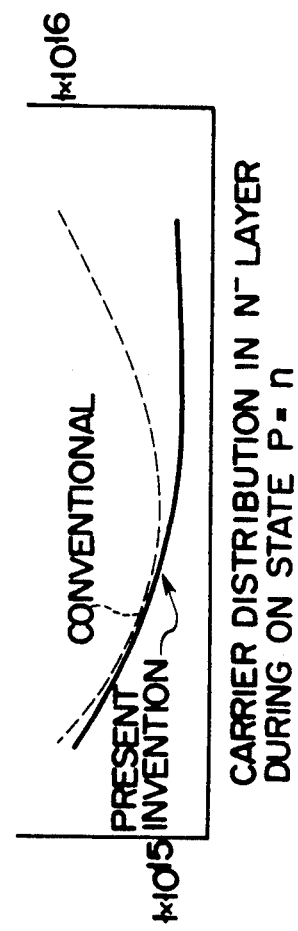

Referring now to FIGS. 29A, 29B, 29C and 29D, there is provided another diode according to the present invention. In this embodiment, carrier injection blocking layers 10 are formed in the portion on the cathode side, as shown in FIG. 29A. That is, the cathode layer 3 has a double-layered structure formed of an n⁺-type layer 3a and n⁺⁺-type layers 3b of higher impurity concentration and the n⁺⁺-type layers 3b are dispersedly arranged in the cathode side. According to this embodiment, a tail current of a reverse recovery current is reduced.

Figure 31:
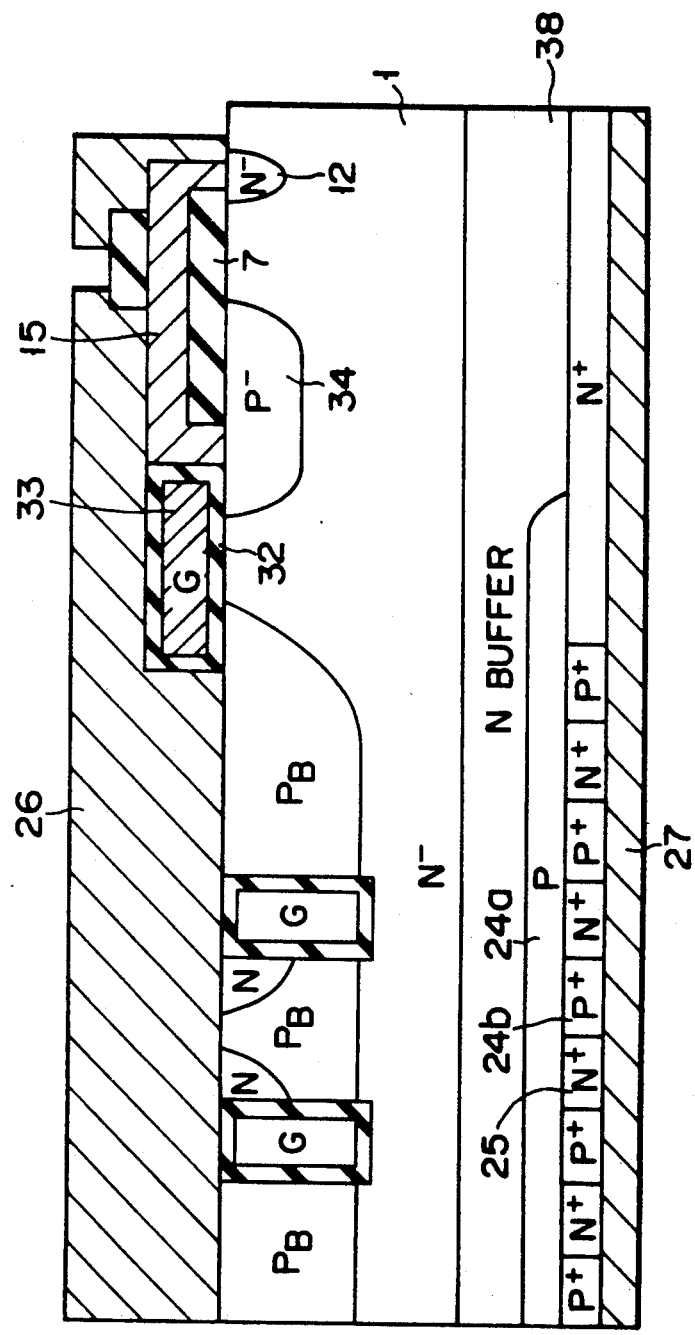

Referring now to FIGS. 30 and 31, there are provided other IGBTs according to the present invention. These IGBTs have trench gate structures. The IGBT of FIG. 30 is a modification of the device shown in FIG. 23. The IGBT of FIG. 31 is a modification of the device shown in FIG. 27. When the present invention is applied to the device having the trench gate structure, the device characteristics are improved.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the genera inventive concept as defined by the appended claims and their equivalents.

What is claimed is:

1. A high breakdown voltage semiconductor device comprising:
   a pn junction diode section including:
   a first semiconductor layer of a first conductivity type,
   a second semiconductor layer of a second conductivity type formed on said first semiconductor layer,
   contact layers of the second conductivity type with high impurity concentration and dispersedly formed in said second semiconductor layer, and
   current blocking layers of the first conductivity type with high impurity concentration which are dispersedly formed in said second semiconductor layer, said blocking layers being formed in said second semiconductor layer in a preset area ratio with respect to said contact layers; and a main electrode formed in contact with said contact layers as well as the current blocking layers of said pn junction diode section;

wherein a condition of $Vf > \rho(j/2)D^2$ is satisfied in said high breakdown voltage semiconductor device, where a density of current flowing in said high breakdown voltage semiconductor device is $j$ A/cm$^2$, a sheet resistance of a portion of said second semiconductor layer which lies directly under said current blocking layer is $\rho(\Omega/\square)$, a set of points in a top surface region of said current blocking layer is A(a), a set of points on a boundary between a top surface of said current blocking layer and a top surface of said contact layer is B(b), a distance between any points a and b is $d_{ab}$, (min $d_{ab}$) is defined as a minimum distance of the $d_{ab}$ in the case that the point a is fixed within the set A(a) and the point b is changed within the set B(b), max (min $d_{ab}$) is defined as a maximum distance of the (min $d_{ab}$) in the case that the point a is changed within the set A(a), a distance satisfying the equation D=max (min $d_{ab}$) is D cm, and a junction voltage between said current blocking layer and said second semiconductor layer is Vf volts.

2. A high breakdown voltage semiconductor device according to claim 1, wherein said current blocking layer is formed in a stripe pattern in said contact layer.

3. A high breakdown voltage semiconductor device according to claim 2, wherein a condition of $V = \rho(j/2)(d1^2/4) < Vf$ is satisfied in said high breakdown voltage semiconductor device, where a voltage drop in a lateral direction of the portion of said second semiconductor layer which lies directly under said current blocking layer is V, the sheet resistance of the portion of said second semiconductor layer which lies directly under said current blocking layer is $\rho$, the density of current flowing in the portion of said second semiconductor layer which lies directly under said current blocking layer is j, a width of said current blocking layer is d1, and the junction voltage between said current blocking layer and said second semiconductor layer is Vf.

4. A high breakdown voltage semiconductor device according to claim 1, wherein said first semiconductor layer includes a region in which life time killer is introduced.

5. A high breakdown voltage semiconductor device according to claim 1, wherein said high breakdown voltage semiconductor device is included in a thyristor structure having a cathode emitter layer, two base layers and an anode emitter layer which are sequentially laminated, and said current blocking layer is formed in at least one of the cathode and anode emitter layers of said thyristor structure.

6. A high breakdown voltage semiconductor device according to claim 1, wherein said high breakdown voltage semiconductor device is included in a thyristor structure having a cathode emitter layer, two base layers and an anode emitter layer which are sequentially laminated, and having a turn-on MOS gate, and said current blocking layer is formed in at least one of the cathode and anode emitter layers of said thyristor structure.

7. A high breakdown voltage semiconductor device according to claim 1, wherein said high breakdown voltage semiconductor device is included in a thyristor structure having a cathode emitter layer, two base layers and an anode emitter layer which are sequentially laminated, and having a turn-off MOS gate, and said current blocking layer is formed in the anode emitter layer of said thyristor structure.

8. A high breakdown voltage semiconductor device according to claim 1, wherein said high breakdown voltage semiconductor device is included in a bipolar transistor having an emitter, a base and a collector, and said current blocking layer is formed in at least one of the emitter and collector of said bipolar transistor.

9. A high breakdown voltage semiconductor device comprising:

a pn junction section formed of a first semiconductor layer of a first conductivity type and a second semiconductor layer of a second conductivity type which are formed in contact with each other; and current blocking layers of the first conductivity type with high impurity concentration dispersedly formed in said second semiconductor layer;

wherein a condition of $Vf > \rho(j/2)D^2$ is satisfied in said high breakdown voltage semiconductor device, where a density of current flowing in said high breakdown voltage semiconductor device is $j$ A/cm$^2$, a sheet resistance of a portion of said second semiconductor layer which lies directly under said current blocking layer is $\rho(\Omega/\square)$, a set of points in a top surface region of said current blocking layer is A(a), a set of points on a boundary between the top surface region of said current blocking layer and a top surface region of said second semiconductor layer is B(b), a distance between any points a and b is $d_{ab}$, (min $d_{ab}$) is defined as a minimum distance of the $d_{ab}$ in the case that the point a is fixed within the set A(a) and the point b is changed within the set B(b), max (min $d_{ab}$) is defined as a maximum distance of the (min $d_{ab}$) in the case that the point a is changed within the set A(a), a distance satisfying the equation D=max (min $d_{ab}$) is D cm, and a junction voltage between said current blocking layer and said second semiconductor layer is Vf volts.

10. A high breakdown voltage semiconductor device according to claim 9, wherein said first semiconductor layer includes a region in which life time killer is introduced.

11. A high breakdown voltage semiconductor device according to claim 9, wherein said high breakdown voltage semiconductor device is included in a thyristor structure having a cathode emitter layer, two base layers and an anode emitter layer which are sequentially laminated, and said current blocking layer is formed in at least one of the cathode and anode emitter layers of said thyristor structure.

12. A high breakdown voltage semiconductor device according to claim 9,
wherein said high breakdown voltage semiconductor device is included in a thyristor structure having a cathode emitter layer, two base layers and an anode emitter layer which are sequentially laminated, and having a turn-on MOS gate, and
said current blocking layer is formed in at least one of the cathode and anode emitter layers of said thyristor structure.

13. A high breakdown voltage semiconductor device according to claim 9,
wherein said high breakdown voltage semiconductor device is included in a thyristor structure having a cathode emitter layer, two base layers and an anode emitter layer which are sequentially laminated, and having a turn-off MOS gate, and
said current blocking layer is formed in the anode emitter layer of said thyristor structure.

14. A high breakdown voltage semiconductor device according to claim 9,
wherein said high breakdown voltage semiconductor device is included in a bipolar transistor having an emitter, a base and a collector, and
said current blocking layer is formed in at least one of the emitter and collector of said bipolar transistor.

15. A high breakdown voltage semiconductor device according to claim 9,
wherein said high breakdown voltage semiconductor device is included in an IGBT having a cathode emitter layer, a base layer, a high resistance layer, an anode emitter layer, and a MOS gate formed over a channel region of the base layer, and
said current blocking layer is formed in the anode emitter layer.

16. A high breakdown voltage semiconductor device according to claim 9, wherein said current blocking layer is formed in a stripe pattern in said second semiconductor layer.

17. A high breakdown voltage semiconductor device according to claim 16, wherein a condition of $V = \rho(j/2)(d1^2/4) < Vf$ is satisfied in said high breakdown voltage semiconductor device,
wher a voltage drop in a lateral direction of the portion of said second semiconductor layer which lies directly under said current blocking layer is V, the sheet resistance of the portion of said second semiconductor layer which lies directly under said current blocking layer is $\rho$, the density of current flowing in the portion of said second semiconductor layer which lies directly under said current blocking layer is j, a width of said current blocking layer is d1, and the junction voltage between said current blocking layer and said second semiconductor layer is Vf.

18. A high breakdown voltage semiconductor device according to claim 1,
wherein said high breakdown voltage semiconductor device is included in an IGBT having a cathode emitter layer, a base layer, a high resistance layer, an anode emitter layer, and a MOS gate formed over a channel region of the base layer, and
said current blocking layer is formed in the anode emitter layer.

19. A high breakdown voltage semiconductor device comprising:
a pn junction section formed of a first semiconductor layer of a first conductivity type and a second semiconductor layer of a second conductivity type which are formed in contact with each other;
first current blocking layers of the first conductivity type with high impurity concentration dispersedly formed in said second semiconductor layer; and
second current blocking layers of the second conductivity type with high impurity concentration dispersedly formed in said first semiconductor;
wherein a condition of $Vf > \rho(j/2)D^2$ is satisfied in said high breakdown voltage semiconductor device,
where a density of current flowing in said high breakdown voltage semiconductor device is j [A/cm$^2$], a sheet resistances of a portion of said second semiconductor layer which lies directly under said current blocking layer is $\rho(\Omega/\square)$, a set of points in a top surface region of at least one of said first and second current blocking layers is A(a), a set of points on a boundary between a top surface region of one of said first and second current blocking layers and a top surface region of said second semiconductor layer is B(b), a distance between any points a and b is $d_{ab}$, (min $d_{ab}$) is defined as a minimum distance of the $d_{ab}$ in the case that the point a is fixed within the set A(a) and the point b is changed within the set B(b), max (min $d_{ab}$) is defined as a maximum distance of the (min $d_{ab}$) in the case that the point a is changed within the set A(a), a distance satisfying the equation D = max (min $d_{ab}$) is D cm, and a junction voltage between said current blocking layer and said second semiconductor layer is Vf volts.

* * * * *